United States Patent
Moon et al.

(10) Patent No.: US 8,835,252 B2
(45) Date of Patent: Sep. 16, 2014

(54) METHODS OF FABRICATING SEMICONDUCTOR DEVICES HAVING INCREASED AREAS OF STORAGE CONTACTS

(71) Applicant: Samsung Electronics Co., Ltd., Suwon-si (KR)

(72) Inventors: Joon-Seok Moon, Seoul (KR); Jae-Rok Kahng, Seoul (KR); Hyun-Seung Song, Incheon (KR); Dong-Soo Woo, Seoul (KR); Sang-Hyun Lee, Seoul (KR); Hyun-Jung Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/902,202

(22) Filed: May 24, 2013

(65) Prior Publication Data
US 2013/0344666 A1    Dec. 26, 2013

(30) Foreign Application Priority Data

Jun. 21, 2012   (KR) .................. 10-2012-0066907

(51) Int. Cl.
*H01L 21/00* (2006.01)
*H01L 27/108* (2006.01)
*H01L 29/788* (2006.01)

(52) U.S. Cl.
CPC ........ *H01L 29/788* (2013.01); *H01L 27/10876* (2013.01); *H01L 27/10823* (2013.01); *H01L 27/10885* (2013.01)
USPC .......................................... 438/253; 438/396

(58) Field of Classification Search
USPC ................. 438/253–256, 396–399
See application file for complete search history.

(56) References Cited

U.S. PATENT DOCUMENTS

| 6,010,935 | A | 1/2000 | Doan |
| 6,048,763 | A | 4/2000 | Doan et al. |
| 6,057,581 | A | 5/2000 | Doan |
| 6,303,953 | B1 | 10/2001 | Doan et al. |
| 6,537,875 | B2 | 3/2003 | Won et al. |
| 6,649,490 | B1 | 11/2003 | Lee et al. |
| 6,870,268 | B2 | 3/2005 | Lee et al. |
| 7,034,408 | B1 | 4/2006 | Schloesser |
| 7,049,648 | B2 | 5/2006 | Won et al. |
| 2003/0214872 | A1* | 11/2003 | Tu ................................. 365/225 |
| 2003/0219942 | A1* | 11/2003 | Choi et al. .................... 438/253 |

(Continued)

FOREIGN PATENT DOCUMENTS

| KR | 10-2004-0037416 A | 5/2004 |
| KR | 10-2008-0029570 A | 4/2008 |

(Continued)

*Primary Examiner* — Richard Booth
(74) *Attorney, Agent, or Firm* — Myers Bigel Sibley & Sajovec

(57) ABSTRACT

Methods of fabricating semiconductor device are provided including forming first through third silicon crystalline layers on first through third surfaces of an active region; removing the first silicon crystalline layer to expose the first surface; forming a bit line stack on the exposed first surface; forming bit line sidewall spacers on both side surfaces of the bit line stack to be vertically aligned with portions of the second and third silicon crystalline layers of the active region; removing the second and third silicon crystalline layers disposed under the bit line sidewall spacers to expose the second and third surfaces of the active region; and forming storage contact plugs in contact with the second and third surfaces of the active region.

17 Claims, 36 Drawing Sheets

(56) References Cited

U.S. PATENT DOCUMENTS

| | | |
|---|---|---|
| 2008/0160740 A1 | 7/2008 | Ahn et al. |
| 2010/0140676 A1 | 6/2010 | Yeom |
| 2010/0327346 A1 | 12/2010 | Jeong et al. |
| 2011/0024811 A1 | 2/2011 | Kim |
| 2011/0212607 A1 | 9/2011 | Kim |
| 2012/0015509 A1 | 1/2012 | Kim |
| 2012/0052643 A1 | 3/2012 | Kim |

FOREIGN PATENT DOCUMENTS

| | | |
|---|---|---|
| KR | 10-2008-0089998 A | 10/2008 |
| KR | 10-2009-0025808 A | 3/2009 |
| KR | 10-2010-0138203 A | 12/2010 |

* cited by examiner

METHODS OF FABRICATING SEMICONDUCTOR DEVICES HAVING INCREASED AREAS OF STORAGE CONTACTS

CROSS-REFERENCE TO RELATED APPLICATION

This application claims priority under 35 U.S.C. §119 to Korean Patent Application No. 10-2012-0066907, filed on Jun. 21, 2012, the disclosure of which is hereby incorporated herein by reference in its entirety.

FIELD

The present inventive concept is generally related to a semiconductor device and, more particularly to methods of fabricating semiconductor devices having storage contacts with increased areas.

BACKGROUND

With the increase in integration density of semiconductor devices, various design and fabrication methods for increasing the area of a storage contact have been proposed.

SUMMARY

Some embodiments of the inventive concept provide a semiconductor device that may reduce etching damage to a storage substrate and increase the area of a storage contact. Further embodiments of the inventive concept provide a semiconductor device in which the area of a storage contact is increased by forming a sacrificial layer and removing the sacrificial layer. Still further embodiments of the inventive concept provide a semiconductor device in which a storage contact portion of an active region retains a recess-free structure to reduce the likelihood of a reduction in distance between the surface of the storage contact portion of the active region and a gate electrode.

Some embodiments of the inventive concept provide methods of fabricating semiconductor devices includes forming a field region in a substrate defining an active region; forming first and second gate lines in the substrate, the first and second gate lines disposed across the active region in a first direction and spaced apart and parallel to each other; forming first through third silicon crystalline layers on first through third surfaces of the active region divided by the first and second gate lines; forming an etch stop layer to cover the entire surface of the substrate having the first through third silicon crystalline layers; removing the first silicon crystalline layer interposed between the first and second gate lines and the etch stop layer to expose the first surface; forming a bit line stack to be electrically connected to the exposed first surface; the bit line stack configured to cross the first and second gate lines and extend in a second direction; forming bit line sidewall spacers on both side surfaces of the bit line stack, the bit line sidewall spacers vertically aligned with portions of the second and third silicon crystalline layers of the active region; forming an interlayer insulating layer to cover the entire surface of the substrate including bit lines and bit line sidewall spacers; removing the interlayer insulating layer to form storage contact holes exposing the etch stop layer disposed on the second and third silicon crystalline layers except portions covered with the bit line sidewall spacers; removing the second and third silicon crystalline layers disposed under the storage contact holes and the bit line sidewall spacers to expose the second and third surfaces of the active region; and forming storage contact plugs in contact with the second and third surfaces of the active region, respectively.

In further embodiments, the bit line stack may include a lower silicide layer electrically connected to the first surface of the active region and a bit line barrier layer, an upper silicide layer, a bit line electrode layer, and a bit line capping layer sequentially stacked on the lower silicide layer.

In still further embodiments, an insulating layer may be provided between the bit line sidewall spacers and the etch stop layer disposed under the bit line sidewall spacers.

Some embodiments of the inventive concept provided methods of fabricating a semiconductor device including forming a field region in a substrate to define an active region; forming first and second gate lines in the substrate, the first and second gate lines disposed across the active region in a first direction and spaced apart and parallel to each other; dividing the active region into a bit line contact portion and first and second storage contact portions by the first and second gate lines; forming a silicon crystalline layer on the bit line contact portion and the first and second storage contact portions of the active region; forming an etch stop layer and a first interlayer insulating layer on the silicon crystalline layer, removing the first interlayer insulating layer, the etch stop layer, and the silicon crystalline layer formed on the bit line contact portion interposed between the first and second gate lines to form a bit line contact hole exposing the underlying active region; forming a bit line contact plug in contact with the exposed active region; forming a bit line stack in contact with the bit line contact plug; forming bit line sidewall spacers on both sidewalls of the bit line stack to cover the first interlayer insulating layer disposed on portions of the first and second storage contact portions; forming a second interlayer insulating layer on the entire surface of the substrate including the bit line sidewall spacers; patterning the first and second interlayer insulating layers to form first and second storage contact holes exposing the etch stop layer disposed on the first and second storage contact portions except portions covered with the bit line sidewall spacers; removing the etch stop layer exposed by the first and second storage contact holes to expose the underlying silicon crystalline layer; removing the silicon crystalline layer disposed under the first and second storage contact holes and the bit line sidewall spacers to expose the active region; and forming first and second storage contact plugs in contact with the exposed active region.

BRIEF DESCRIPTION OF THE DRAWINGS

The foregoing and other features and advantages of the present inventive concept will be apparent from the more particular description of embodiments of the inventive concept, as illustrated in the accompanying drawings in which like reference characters refer to the like elements throughout the different views. The drawings are not necessarily to scale, emphasis instead being placed upon illustrating the principles of the inventive concept. In the drawings:

FIGS. 5A through 25A and 5B through 25B are cross-sections taken along lines I-I and II-II of FIG. 1 illustrating processing steps in the fabrication of semiconductor devices in accordance with some embodiments of the inventive concept.

DETAILED DESCRIPTION OF EMBODIMENTS

Figure 1:
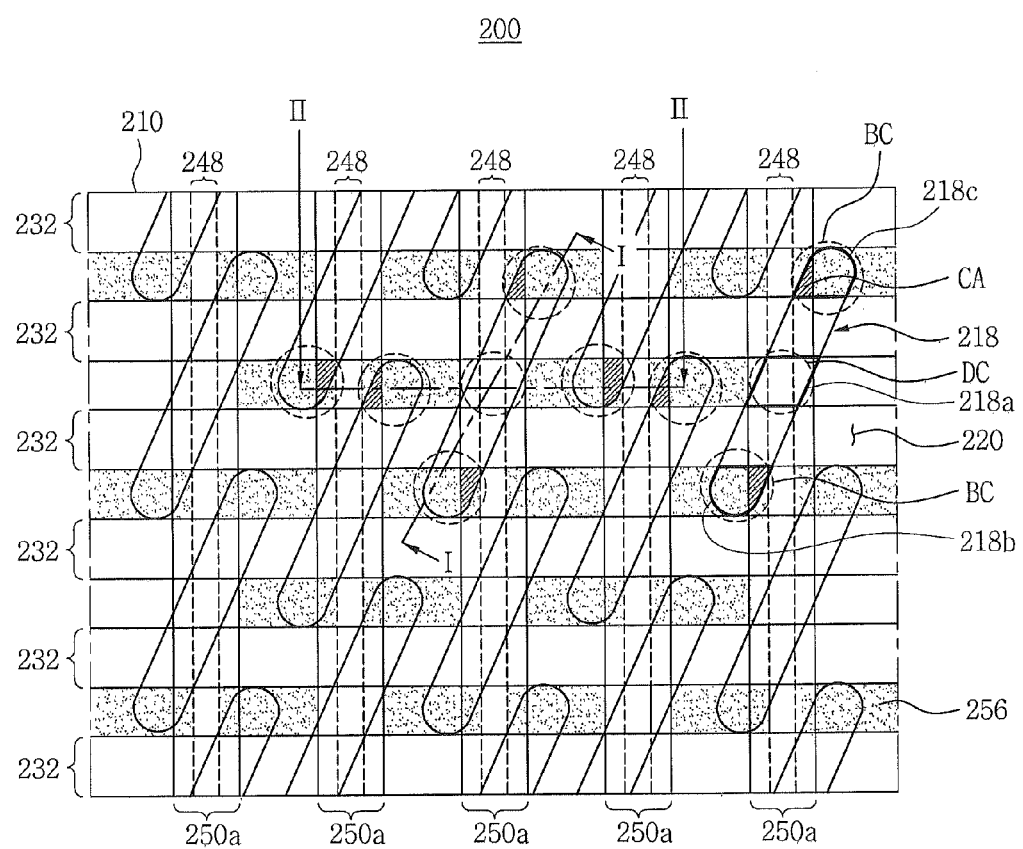
FIG. 1 is a plan view illustrating the layout of a semiconductor device according to some embodiments of the inventive concept.

The present invention will now be discussed more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements discussed as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be discussed with reference to perspective views, cross-sections, and/or plan views, in which embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Referring now to FIG. 1, a plan view illustrating the layout of a semiconductor device 200 according to some embodiments of the inventive concept will be discussed. As illustrated in FIG. 1, the semiconductor device 200 includes a substrate 210, and active regions 218 and field regions 220 defined on the substrate 210. The active regions 218 may be a plurality of island-type exposed regions of the surface of the substrate 210. The island-type active regions 218 may have bar shapes elongated at an angle to the substrate 210.

The semiconductor device 200 according to some embodiments of the inventive concept may include a plurality of word lines (or gate lines) 232, which may extend in a first direction parallel to one another, a plurality of bit line stacks 248, which may extend in a second direction parallel to one another and cross the word lines (or gate lines) 232 at right angles, and storage contact plugs 256, which may be in contact with both sides of the active regions 218.

The plurality of active regions 218 may cross the word lines (or gate lines) 232 and the bit line stacks 248 at an angle to the word lines (or gate lines) 232 and the bit line stacks 248. Each of the active regions 218 may be divided by separated word lines 232 into a first surface 218a, a second surface 218b, and a third surface 218c. The first surface 218a of each of the active regions 218 may include a bit line contact portion DC between the separated word lines 232 in contact with the corresponding one of the bit line stacks 248. Each of the second and third surfaces 218b and 218c of each of the active regions 218 may include a storage contact portion BC, which may be in contact with the storage contact plug 256.

Bit line sidewall spacers 250a may be provided on both sides of each of the bit line stacks 248. Portions illustrated with dotted lines may refer to the bit line stacks 248, and solid lines illustrated on both sides of the bit line stacks 248 may refer to outer lines of the bit line sidewall spacers 250a.

In the semiconductor device 200 according to some embodiments of the inventive concept, a contact area of the storage contact portion BC may further increase by as much as an area CA where the bit line sidewall spacers 250 overlap the second and third surfaces 218b and 218c of the active region 218.

This effect will now be discussed with reference to the later-described cross-sections of semiconductor devices and methods of fabricating the semiconductor devices.

Figure 2:
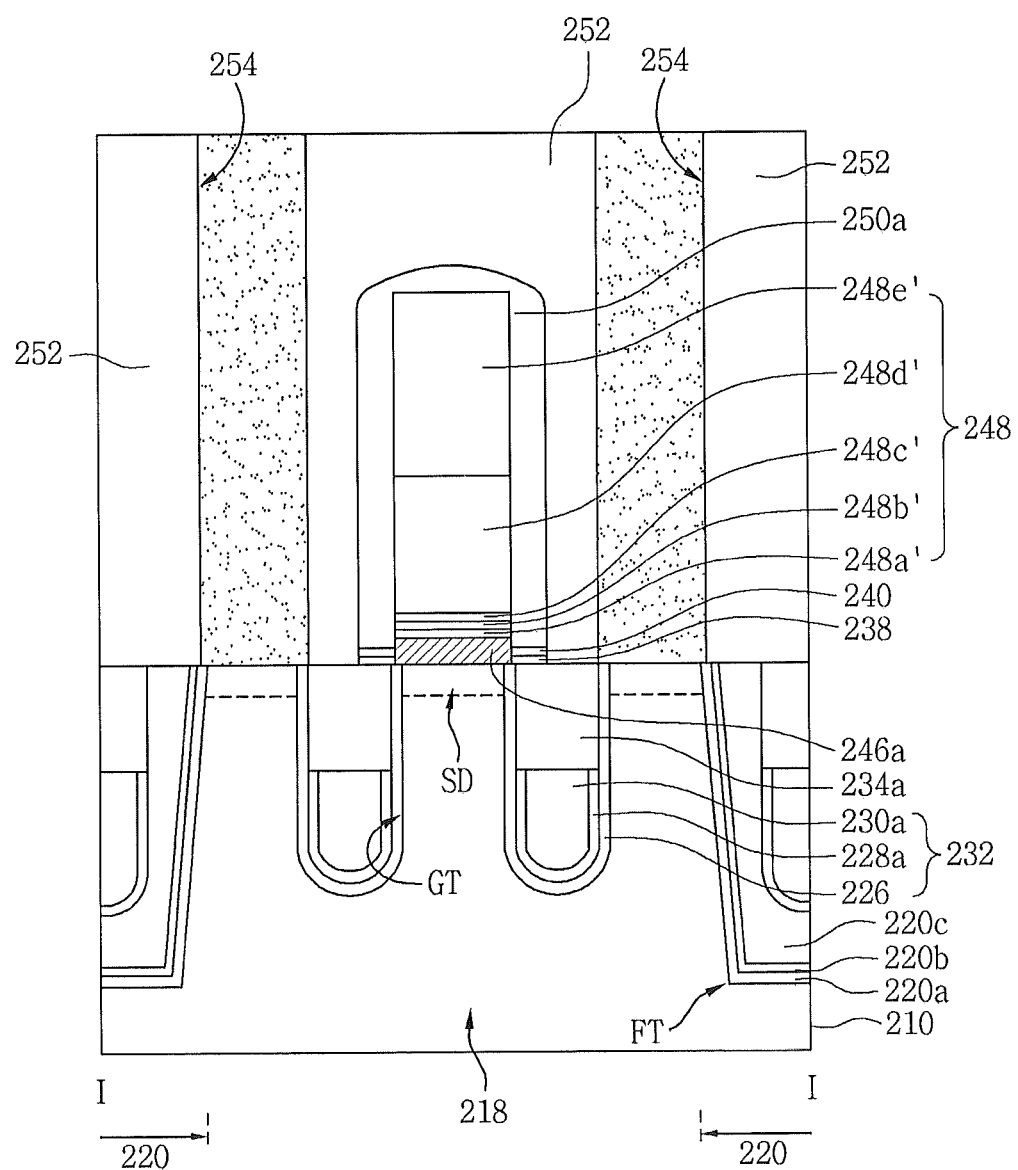
FIGS. 2 and 3 are cross-sections taken along lines I-I and II-II of FIG. 1.
Figure 3:
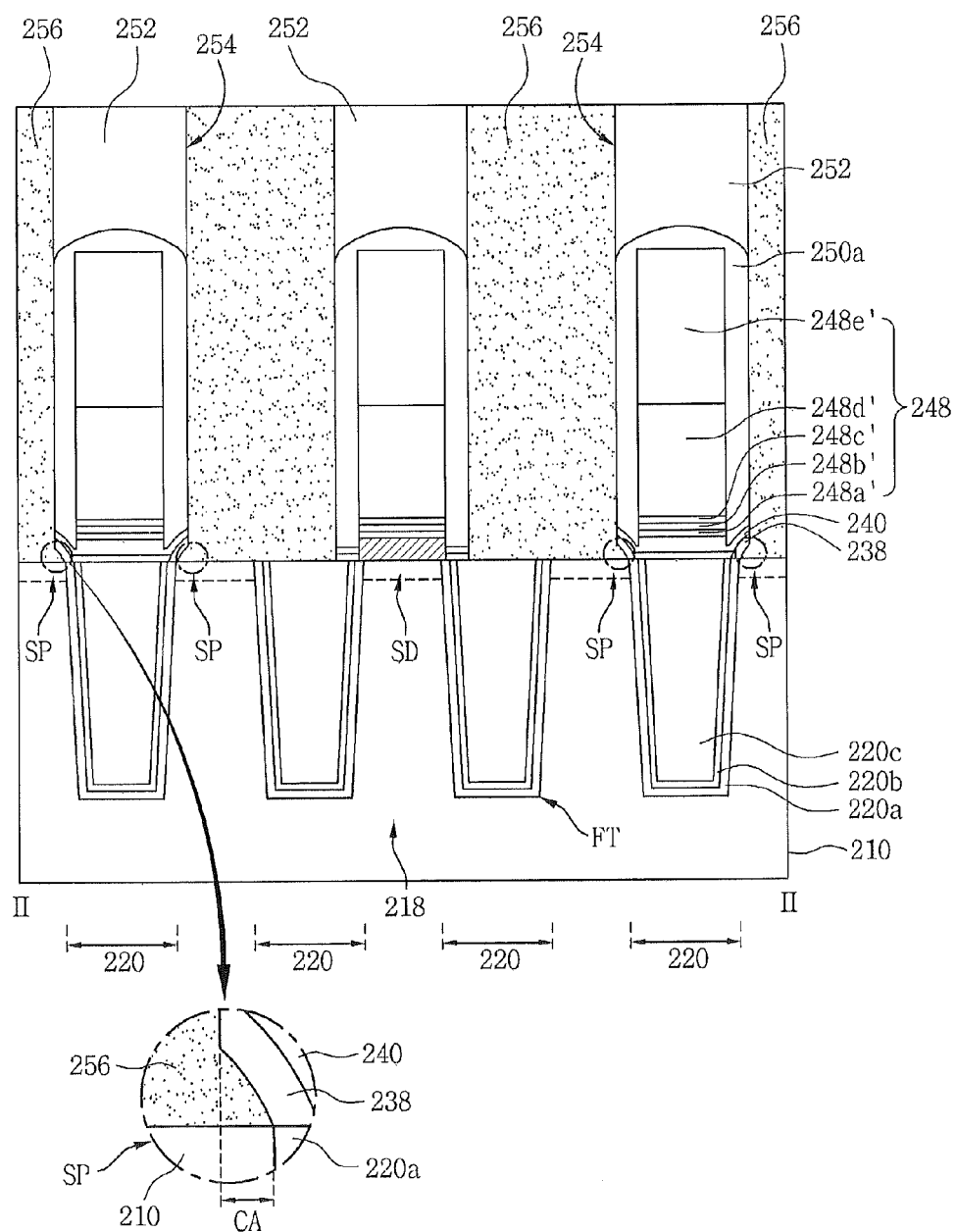

Referring now to FIGS. 2 and 3, cross-sections taken along lines I-I and II-II of FIG. 1, respectively, will be discussed. Hereinafter, the word lines 232 will be referred to as gate lines 232. As illustrated in FIGS. 2 and 3, a semiconductor device 200 according to some embodiments of the inventive concept may include a substrate 210, gate lines 232 buried in the substrate 210, and bit line contact plugs 246a, bit line stacks 248, and storage contact plugs 256 formed on the substrate 210. The substrate 210 may include a silicon (Si) wafer. The substrate 210 may include active regions 218 and field regions 220.

Each of the field regions 220 may include a field trench FT, a field trench liner 220a and 220b formed on bottom and side surfaces of the field trench FT, and a field trench insulating layer 220c filling the field trench FT. The field trench liner 220a and 220b may include a first insulating layer 220a and a second insulating layer 220b sequentially stacked on the bottom and side surfaces of the field trench FT. For example, the first insulating layer 220a may include silicon oxide, and the second insulating layer 220b may include silicon nitride. The field trench insulating layer 220c may include silicon oxide.

The semiconductor device 200 according to some embodiments of the inventive concept may include gate lines 232 formed within gate trenches GT recessed in the substrate 210. Each of the gate lines 232 may include a gate insulating layer 225 formed on bottom and side surfaces of the gate trench GT, a gate barrier layer 226a formed on portions of bottom and side surfaces of the gate insulating layer 225, and a gate electrode 230a formed on the gate barrier layer 226a to fill a portion of the gate trench GT. Surfaces of the gate barrier layer 226a and the gate electrode 230a may be formed to be lower than ½ the depth of the gate trench GT. The remaining portion of the gate trench GT, except the gate electrode 230a and the gate barrier layer 226, may be filled with a gate capping layer 234a. The gate insulating layer 226 may include a metal oxide having a high dielectric constant, such as a silicon oxide ($SiO_2$) layer or a hafnium oxide ($HfO_x$) layer. The gate barrier layer 228a may include a barrier metal, such as titanium (Ti), titanium nitride (TiN), tantalum (Ta), tantalum nitride (TaN), ruthenium (Ru), ruthenium nitride (RuN), or tungsten nitride (WN). The gate electrode 230a may include a conductive material, such as tungsten. The gate capping layer 234a may include an insulating material, such as silicon oxide ($SiO_2$).

The active regions 218 between the gate lines 232 may include doped impurity layers SD. The impurity layers SD may be referred to as source and drain regions. Each of the doped active regions 218 may be divided into a storage contact portion BC and a bit line contact portion DC. The bit line contact plug 246a may be in contact with the bit line contact portion DC, and the storage contact plug 256 may be in contact with the storage contact portion BC.

The bit line contact plugs 246a may electrically connect the bit line stacks 248 with the active regions 218 and include a conductive material, such as doped silicon, a metal, or a metal silicide.

Each of the bit line stacks 248 may include a lower silicide layer 248a', a bit line barrier layer 248b', an upper silicide layer 248c', a bit line electrode layer 248d', and a bit line capping layer 248e'. Each of the lower and upper metal silicide layers 248a' and 248c' may include titanium silicide (TiSi), tungsten silicide (WSi), tantalum silicide (TaSi), cobalt silicide (CoSi), or various other metal silicides. The bit line barrier layer 248b' may include titanium, tantalum, tantalum nitride, tungsten nitride, titanium nitride, or various other barrier metals. The bit line electrode layer 248d' may include tungsten, aluminum (Al), copper (Cu), or nickel (Ni), and the bit line capping layer 250a may include silicon nitride (SiNx).

Bit line sidewall spacers 250a may be formed on both sidewalls of each of the bit line stacks 248. The bit line sidewall spacers 250a may surround sidewalls and a top surface of each of the bit line stacks 248, or surround only the sidewalls of each of the bit line stacks 248. The bit line sidewall spacers 250a may include silicon nitride (SiNx). The bit line sidewall spacers 250a may be formed such that spaces SP are formed under portions of the bit line sidewall spacers 250a overlapping the storage contact portions BC of the active regions 218.

The storage contact plug 256 may be electrically connected to the active region 218 and include doped polysilicon (doped poly-Si). The storage contact plug 256 may fill the space SP disposed under the bit line sidewall spacers 250a. Thus, the contact area of the storage contact plug 256 may further increase by as much as the active region CA exposed by the underlying space SP. Thus, when the contact area of the storage contact plug 256 is increased, storage contact resistance may be reduced. Accordingly, a leakage current or gate-induced drain leakage (GIDL) current may be reduced.

Figure 4:
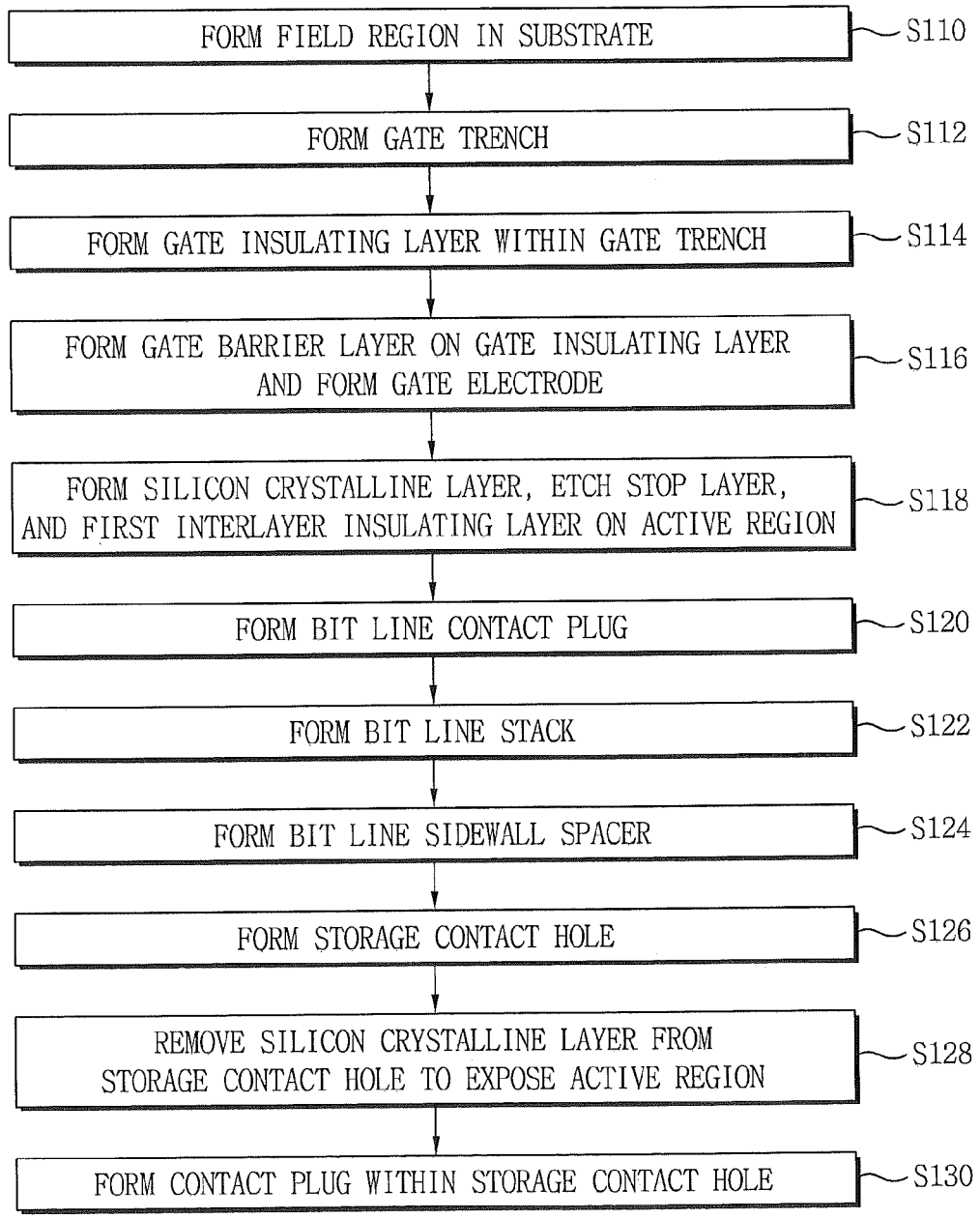
FIG. 4 is a flowchart illustrating processing steps in the fabrication of semiconductor devices according to some embodiments of the inventive concept.

FIG. 4 is a flowchart illustrating processing steps in the fabrication of semiconductor devices according to some embodiments of the inventive concept. FIGS. 5A through 25A and 5B through 25B are cross-sections taken along lines I-I and II-II of FIG. 1, respectively, illustrating processing steps in the fabrication of semiconductor devices according to some embodiments of the inventive concept.

Figure 5A:
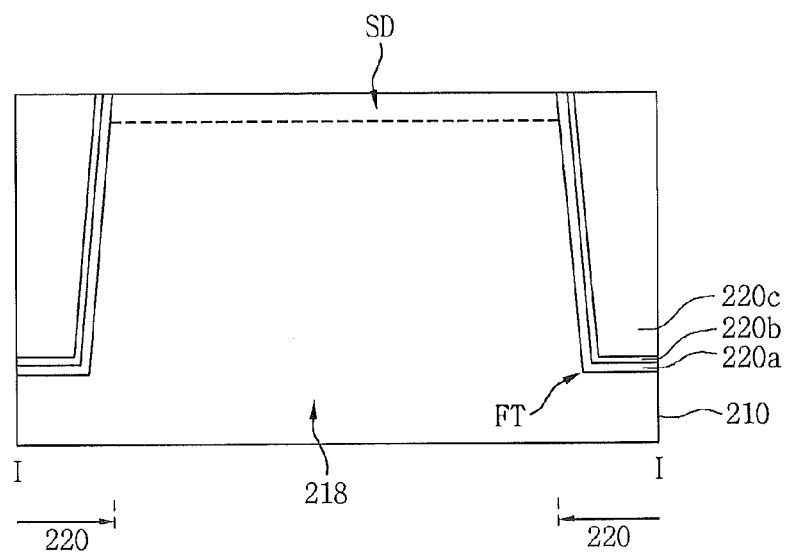
Figure 5B:
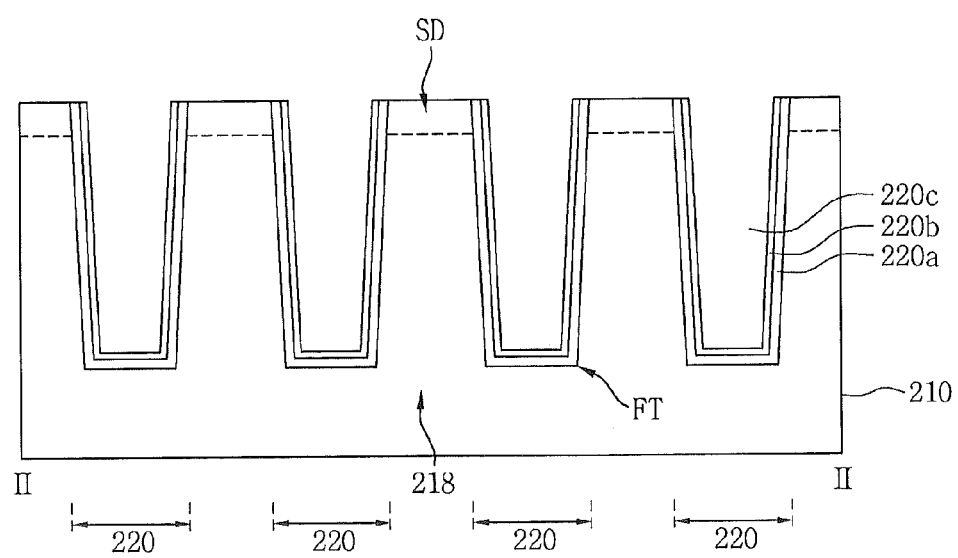

Processing steps in the fabrication of semiconductor device according to some embodiments of the inventive concept will be discussed with respect to FIGS. 4, 5A through 25A, and 5B through 25B. Referring first to FIGS. 4, 5A, and 5B, the process begins by forming active regions 218 and field regions 220 defining the active regions 218 in a semiconductor substrate 210 (operation S110). The field region 220 may be formed using a shallow trench isolation (STI) technique. The formation of the field region 220 may include forming field trenches FT in the substrate 210, forming a field trench liner 220a and 220b on inner wall of the field trench FT, and forming a field trench insulating layer 220c on the field trench liner 220a and 220b to fill the field trench FT. The field trench liner 220a and 220b may be conformally formed on bottom and side surfaces of the field trench FT. The field trench liner 220a and 220b may include a first insulating layer 220a and a second insulating layer 220b. For example, the first insulating layer 220a may include silicon oxide ($SiO_2$), and the second insulating layer 220b may include silicon nitride (SiNx). The formation of the first and second insulating layers 220a and 220b may include a thermal oxidation process or a chemical vapor deposition (CVD) process. The field trench insulating layer 220c may include silicon oxide ($SiO_2$), and the formation of the field trench insulating layer 220c may include a high density plasma-chemical vapor deposition (HDP-CVD) process. P-type impurities or n-type impurities may be doped into the active regions 218 to form impurity layers SD, which may be referred to as source or drain regions.

Figure 6A:
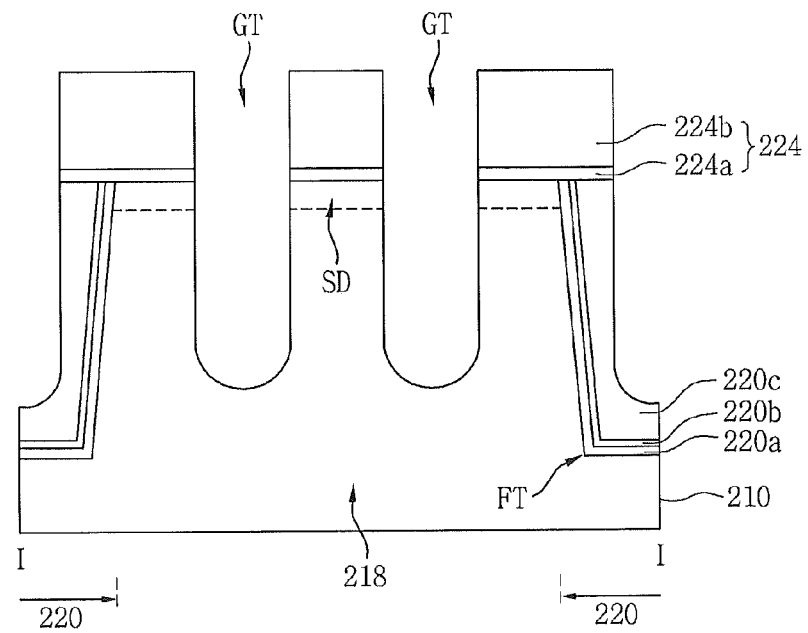
Figure 6B:
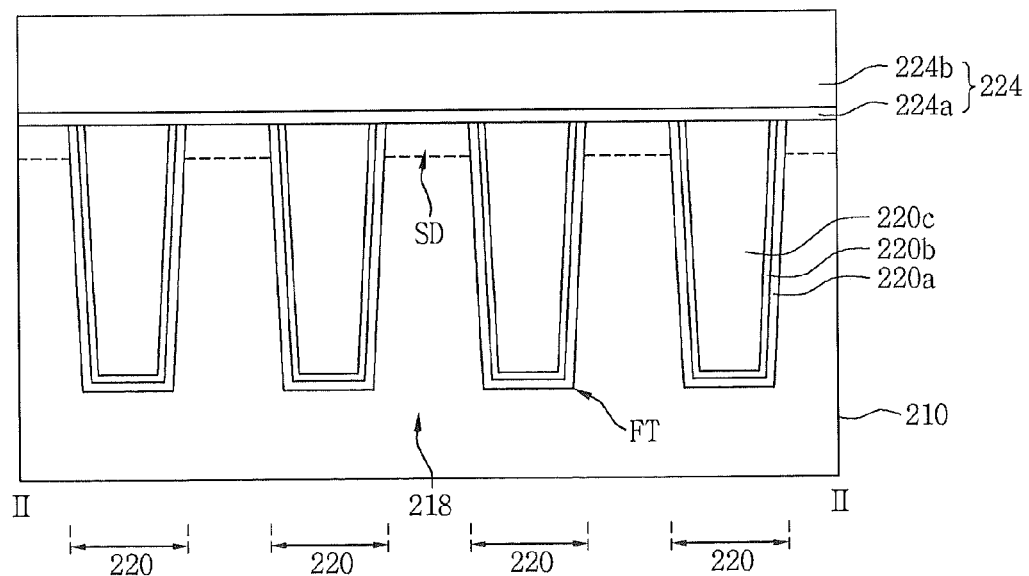

Referring to FIGS. 4, 6A, and 6B, the method of fabricating semiconductor devices 200 according to some embodiments of the inventive concept may include forming gate trenches GT in the substrate 210 (operation S112). The formation of the gate trenches GT may include forming a first insulating layer 224a and a second insulating layer 224b on a surface of the substrate 210, and patterning the first and second insulating layers 224a and 224b to form a gate trench mask 224. Exposed portions of the substrate 210 may be recessed to a predetermined depth using the gate trench mask 224 as an etch stop layer, thereby forming the gate trenches GT.

Figure 7A:
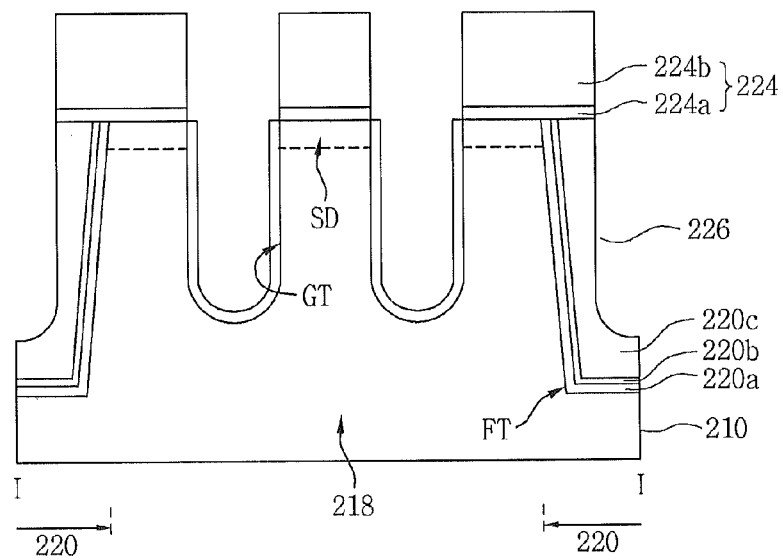
Figure 7B:
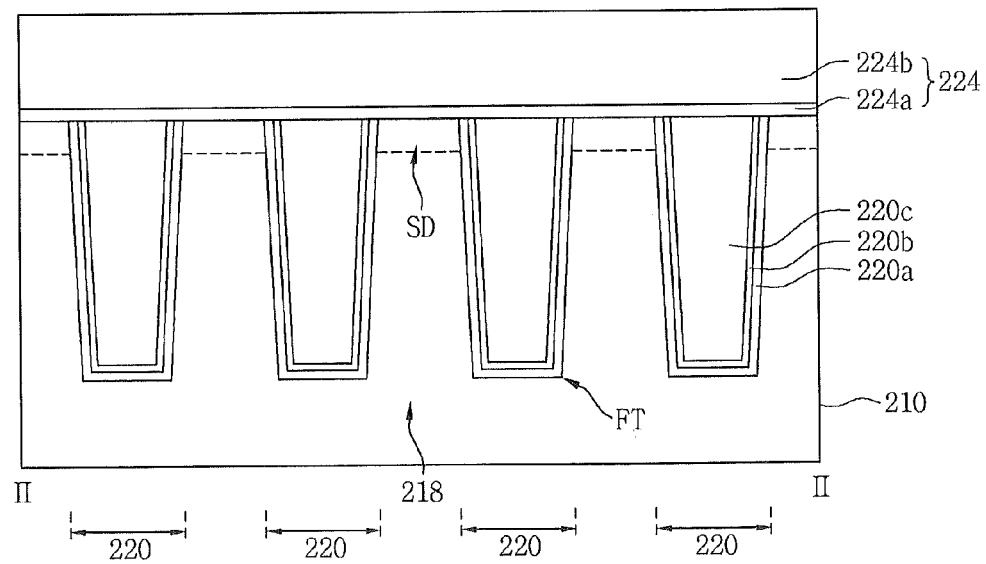

Referring now to FIGS. 7A, and 7B, the method of fabricating semiconductor devices according to some embodiments of the inventive concept may include forming a gate insulating layer 226 within the gate trenches GT (operation S114). The gate insulating layer 226 may be formed on inner walls of the gate trenches GT. The gate insulating layer 226 may include an oxide layer. The formation of the gate insulating layer 226 may include a thermal oxidation process.

Figure 8A:
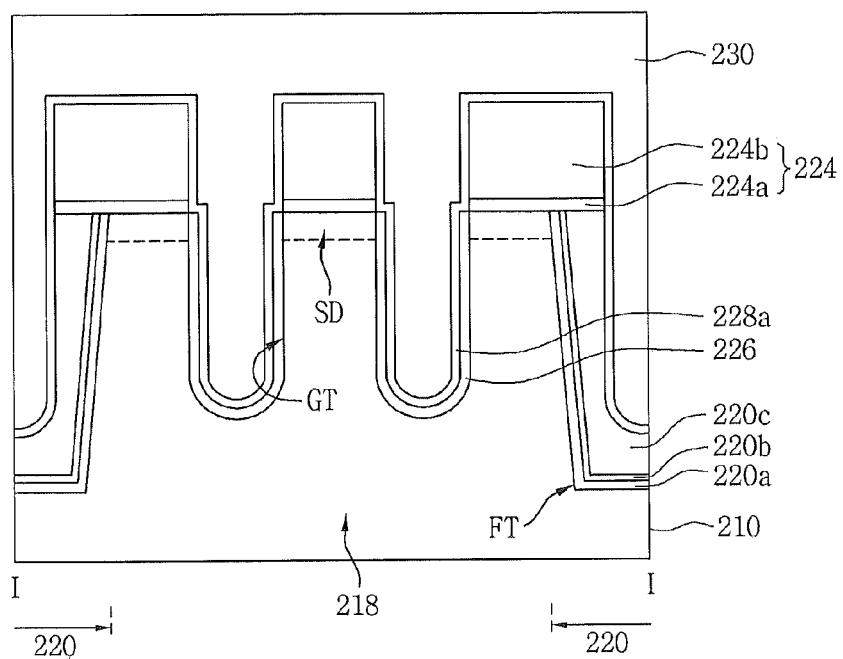
Figure 8B:
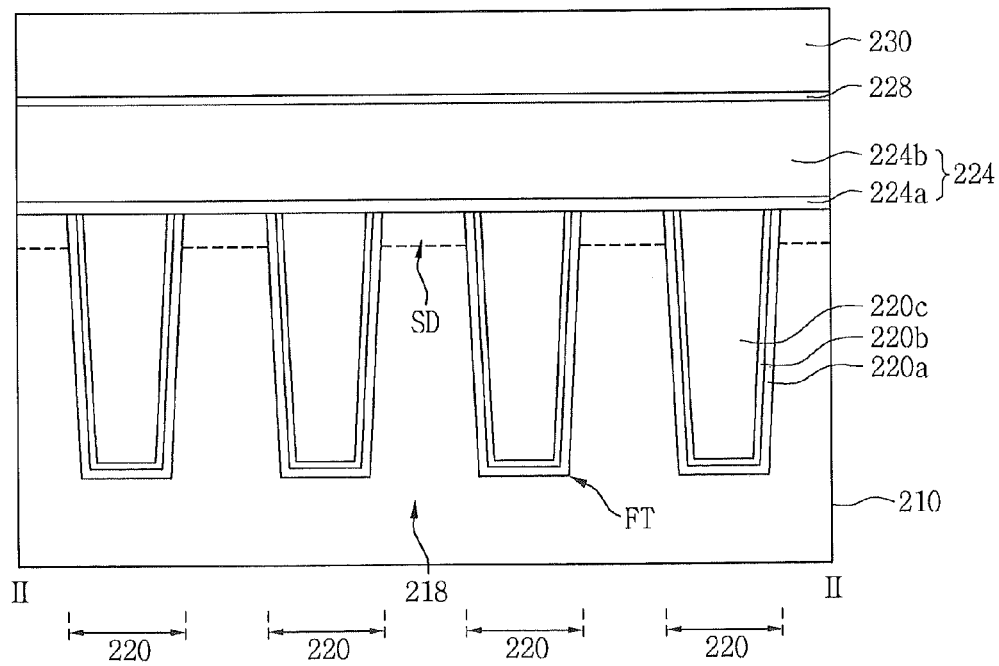

Referring now to FIGS. 8A and 8B, the method of fabricating semiconductor devices according to some embodiments of the inventive concept may include forming a gate barrier layer 228 and a gate electrode layer 230 on the gate insulating layer 226. The gate barrier layer 228 and the gate electrode layer 230 may be formed on the gate insulating layer 226 and the gate trench mask 224. The gate barrier layer 228 may include titanium, titanium nitride, tantalum, tantalum nitride, ruthenium, ruthenium nitride, tungsten, tungsten titanium, and tungsten nitride. The gate electrode layer 230 may include a conductive material, such as tungsten. The formation of the gate barrier layer 228 and the gate electrode layer 230 may include an ALD process or a CVD process.

Figure 9A:
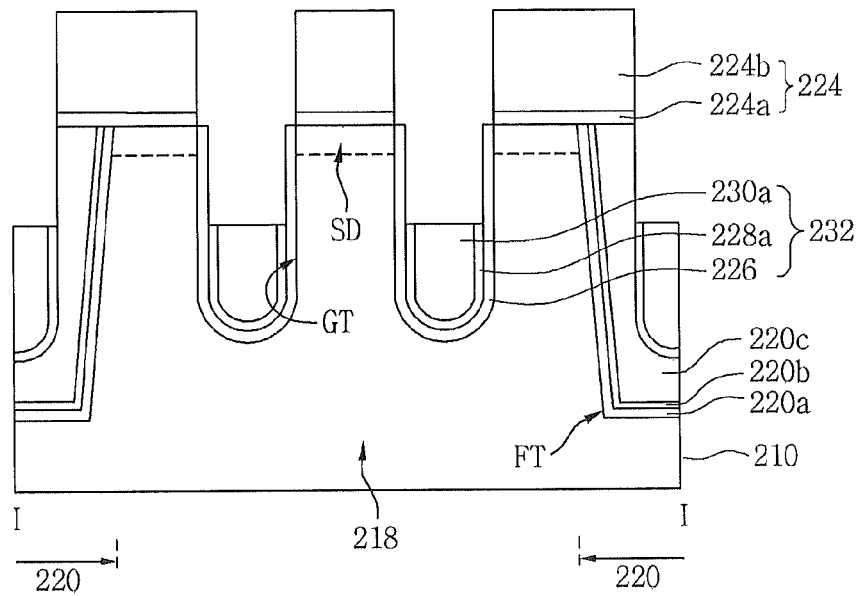
Figure 9B:
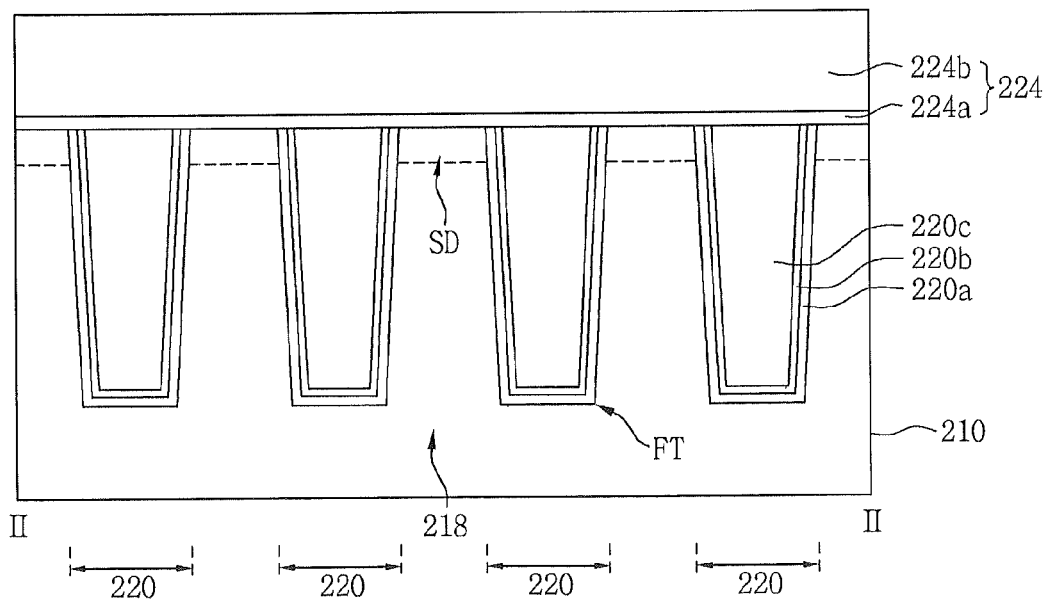

Referring now to FIGS. 4, 9A, and 9B, the method of fabricating semiconductor devices according to some embodiments of the inventive concept may include forming a gate barrier layer 228a and a gate electrode 230a within the gate trenches GT (operation 116). The formation of the gate barrier layer 228a and the gate electrode 230a within the gate trenches GT may include recessing surfaces of the gate barrier layer 228a and the gate electrode 230a to a height lower than ½ the depth of the gate trenches GT. In some embodiments, the process of recessing the gate barrier layer 228a and the gate electrode GT may include an etchback process.

Figure 10A:
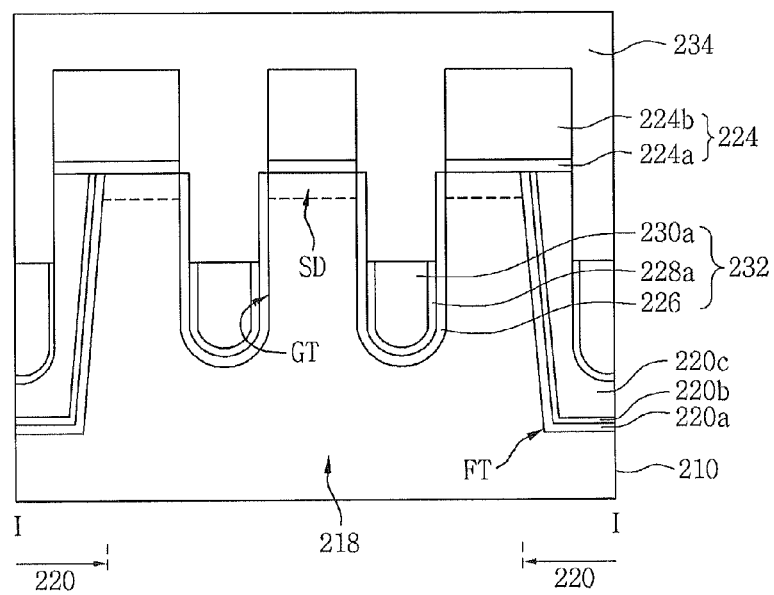
Figure 10B:
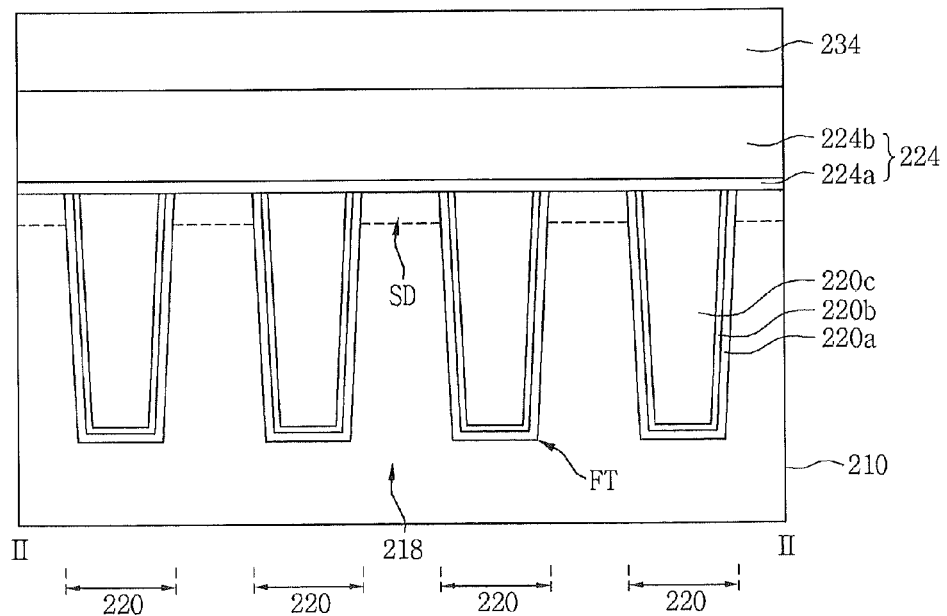

Referring now to FIGS. 10A and 10B, the method of fabricating semiconductor devices according to some embodiments of the inventive concept may include forming a gate capping layer 234 to cover the gate insulating layer 226, the gate barrier layer 228, the gate electrode 230a, and the gate trench mask 224. The formation of the gate capping layer 234 may include a CVD process. The gate capping layer 234 may include silicon nitride.

Figure 11A:
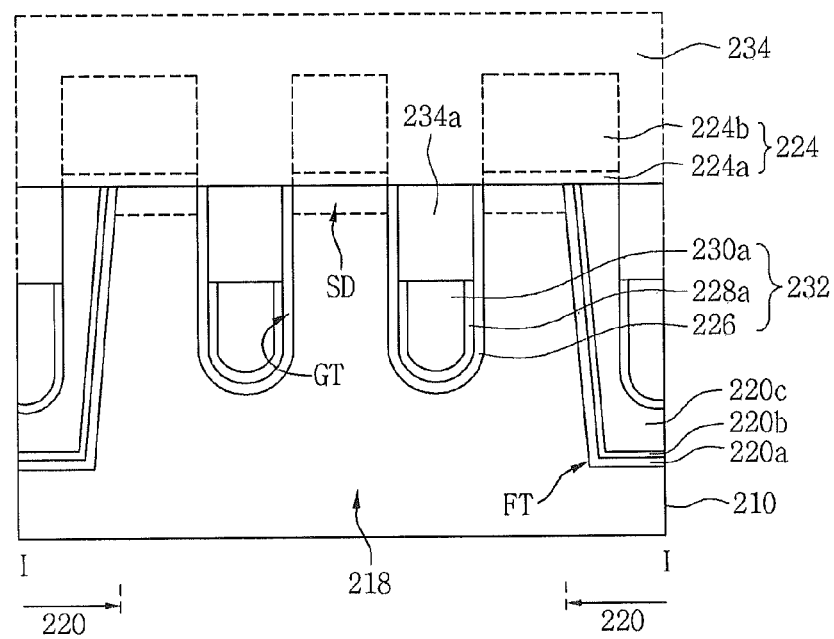
Figure 11B:
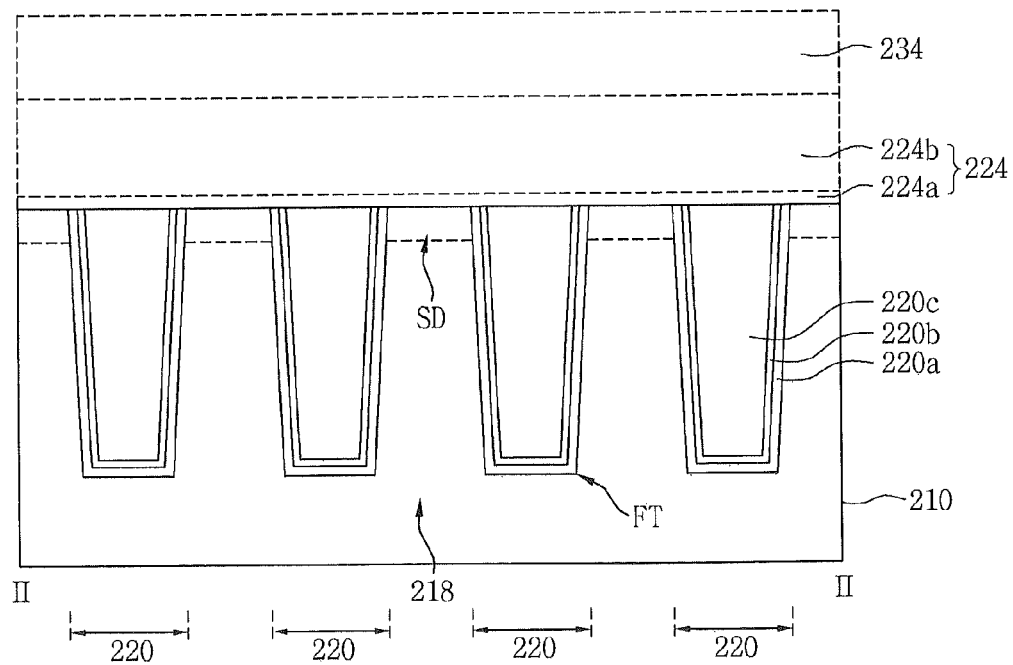

Referring now to FIGS. 11A and 11B, the method of fabricating semiconductor devices according to some embodiments of the inventive concept may include forming a gate capping layer 234a within the gate trenches GT. The formation of the gate capping layer 234a may include removing the gate capping layer 234 covering the gate trench mask 224 and the gate trench mask 224 disposed under the gate capping layer 234. The removal of the gate trench mask 224 and the gate capping layer 234 may include an etchback process. Due to the etchback process, the gate capping layer 234a may fill only the gate trenches GT. In these embodiments, the active regions 218 may be exposed.

Figure 12A:
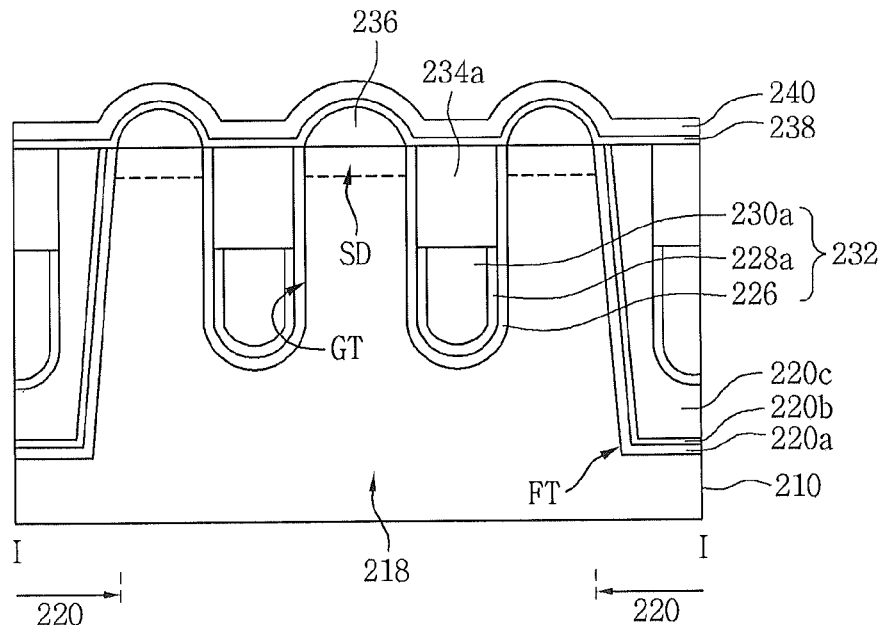
Figure 12B:
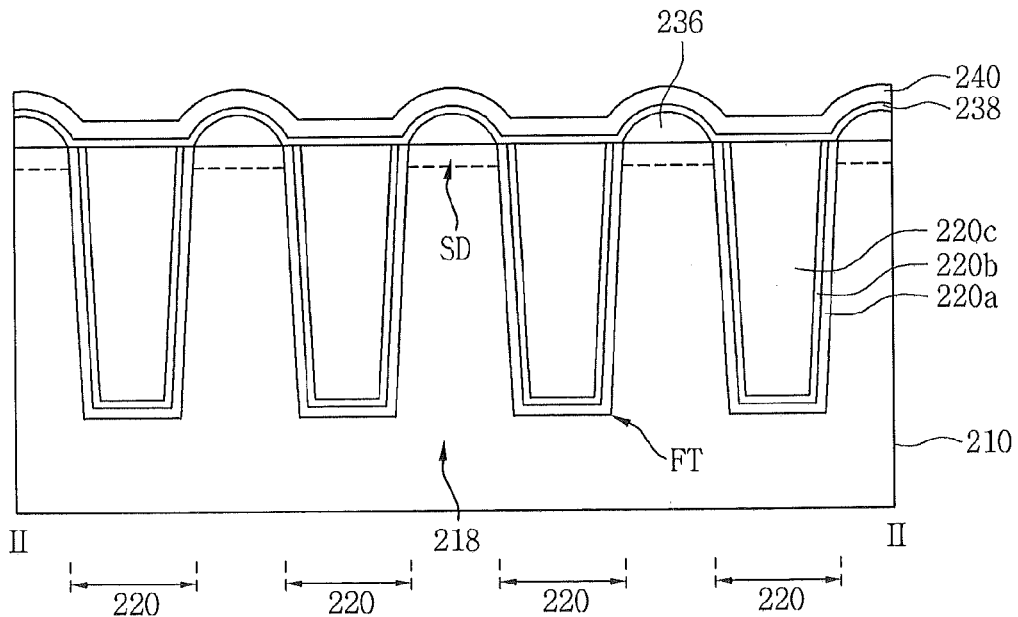

Referring now to FIGS. 4, 12A, and 12B, the method of fabricating semiconductor devices according to some embodiments of the inventive concept may include forming a silicon crystalline layer 236 on the active regions 218, and forming sequentially an etch stop layer 238 and first interlayer insulating layer 240 on the entire surface of the substrate 210 including the silicon crystalline layer 236 (operation S118). The silicon crystalline layer 236 may be formed only on the active regions 218 and have a hemispherical shape. The formation of the silicon crystalline layer 236 may include a selective epitaxial growth (SEG) process. The silicon crystalline layer 236 may include silicon germanium (SiGe), silicon carbon (SiC), or silicon (Si). The etch stop layer 238 and the first interlayer insulating layer 240 may be conformally formed on the silicon crystalline layer 236 and the field region 220. The formation of the etch stop layer 238 may include a CVD process. The etch stop layer 238 may include silicon nitride. The first interlayer insulating layer 240 may include oxide, and the formation of the first interlayer insulating layer 240 may include a CVD process.

Figure 13A:
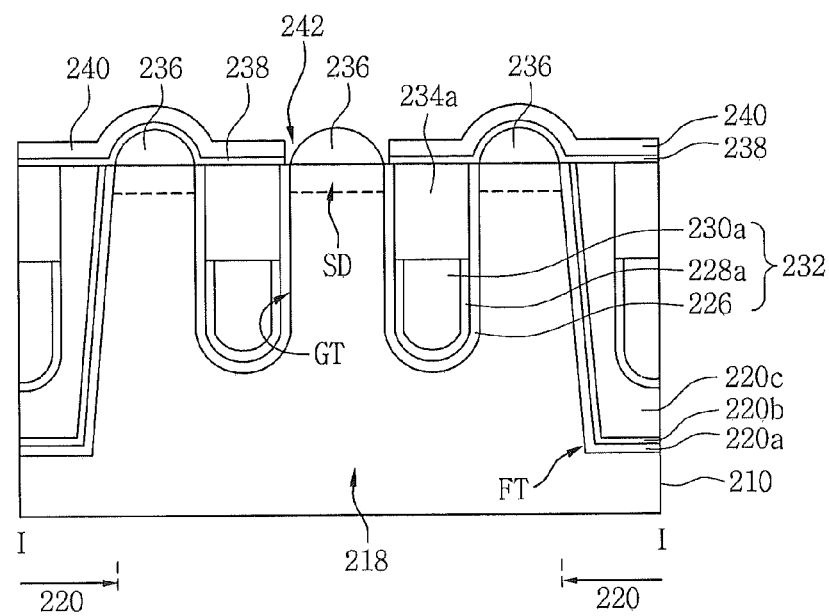
Figure 13B:
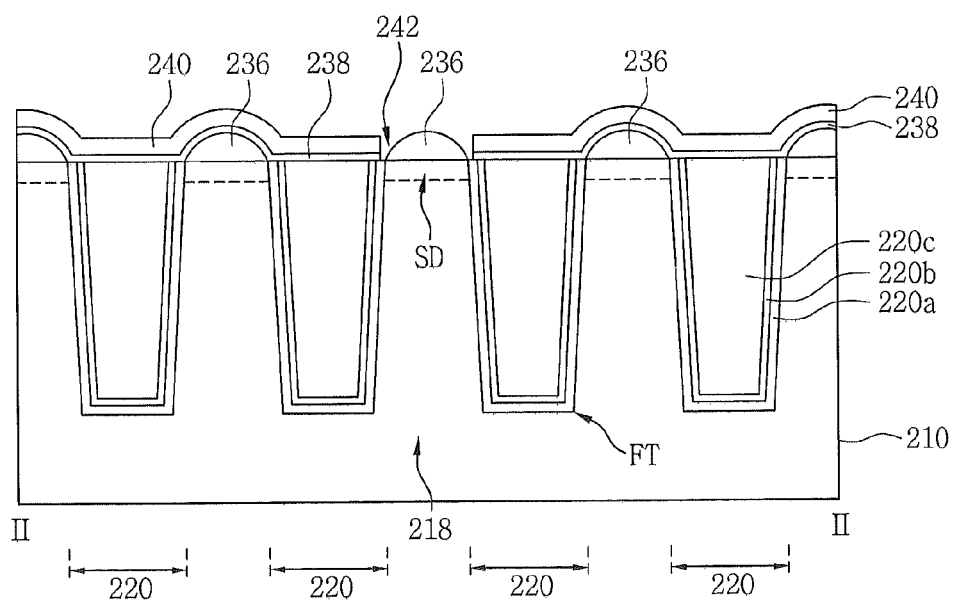

Referring now to FIGS. 13A and 13B, the method of fabricating semiconductor devices according to some embodiments of the inventive concept may include forming a bit line contact hole 242. The formation of the bit line contact hole 242 may include removing the first interlayer insulating layer 240 and the etch stop layer 238 stacked on the bit line contact portion DC to expose the underlying silicon crystalline layer 236. The first interlayer insulating layer 240 and the etch stop layer 238 may be removed using photolithography and etching processes.

Figure 14A:
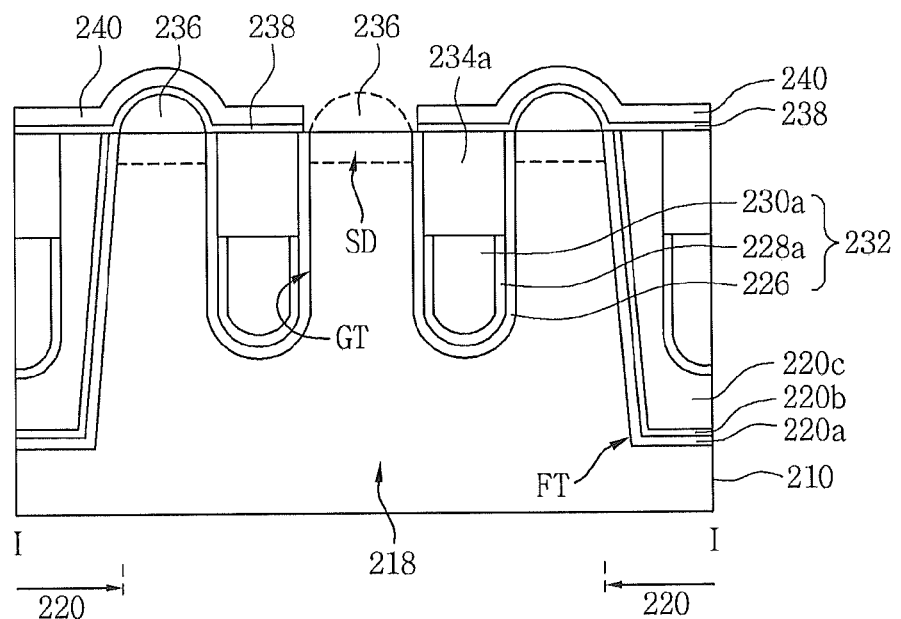
Figure 14B:
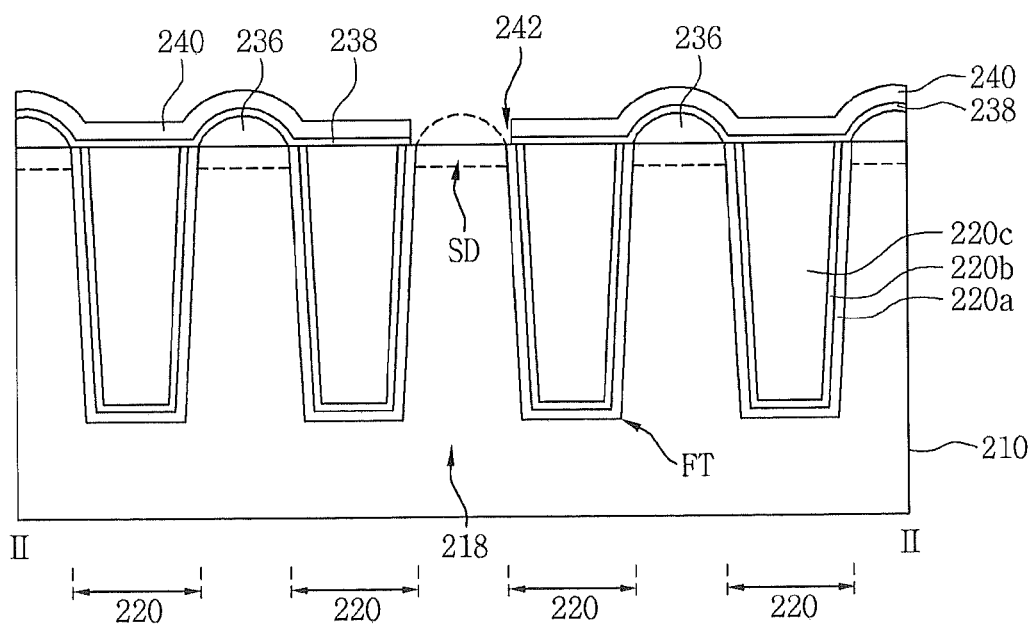

Referring now to FIGS. 14A and 14B, the method of fabricating semiconductor devices according to some embodiments of the inventive concept may include removing the silicon crystalline layer 236 exposed by the bit line contact hole 242.

Figure 15A:
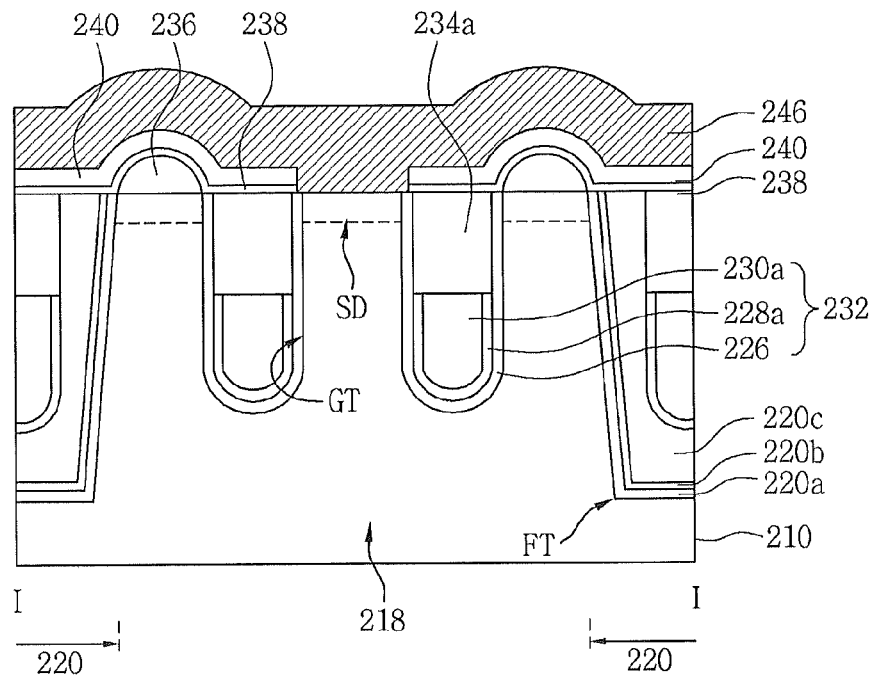
Figure 15B:
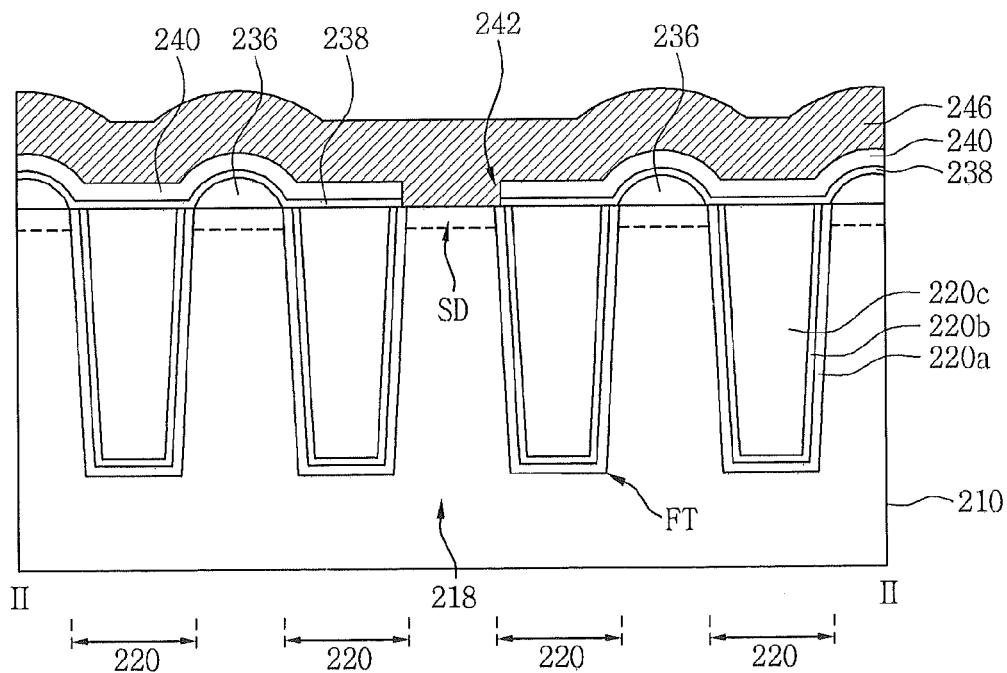

Referring now to FIGS. 15A and 15B, the method of fabricating semiconductor devices according to some embodiments of the inventive concept may include forming a bit line contact plug layer 246 on the first interlayer insulating layer 240 to fill the bit line contact hole 242. A material forming the bit line contact plug layer 246 may include a conductive metal or doped silicon, and the formation of the bit line contact plug layer 246 may include a CVD process.

Figure 16A:
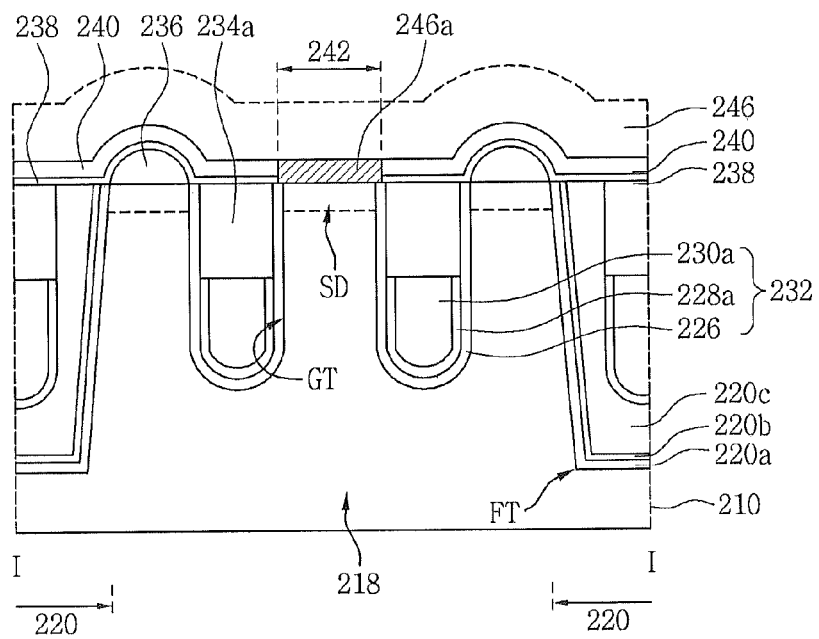
Figure 16B:
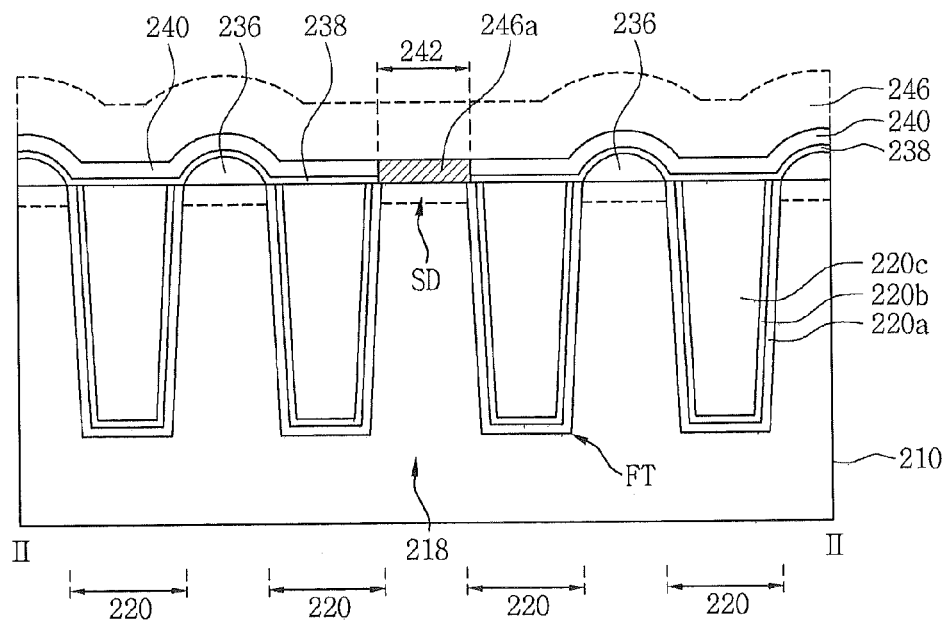

Referring now to FIGS. 16A and 16B, the method of fabricating semiconductor devices according to some embodiments of the inventive concept may include forming a bit line contact plug 246a (operation S120). The formation of the bit line contact plug 246a may include an etchback process. Due to the etchback process, the bit line contact plug layer 246 may be removed from the first interlayer insulating layer 240, and the bit line contact plug 246a may be formed only within the bit line contact hole 242. The bit line contact plug 246a may be in contact with the active region 218 exposed by the bit line contact hole 242.

Figure 17A:
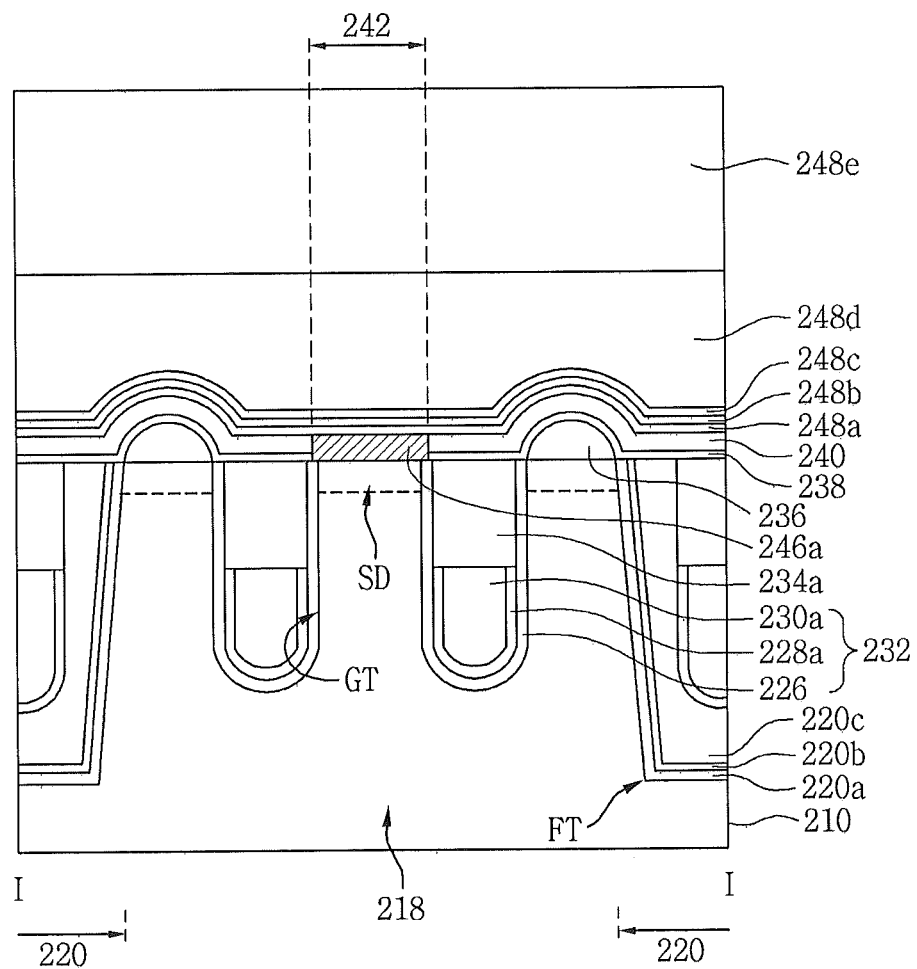
Figure 17B:
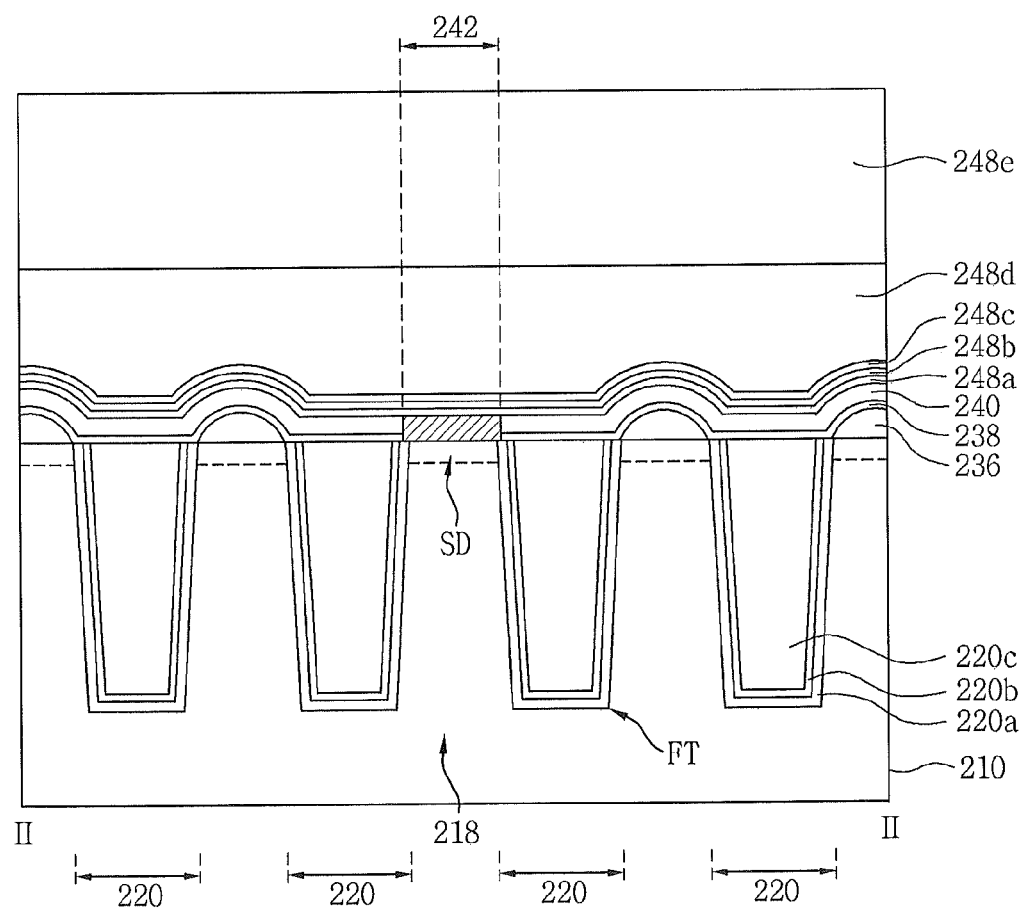

Referring now to FIGS. 17A and 17B, the method of fabricating semiconductor devices according to some embodiments of the inventive concept may include forming a lower silicide layer 248a, a bit line barrier layer 248b, an upper silicide layer 248c, a bit line electrode layer 248d, and a bit line capping layer 248e on the bit line contact plug 246a and the first interlayer insulating layer 240. The lower silicide layer 248a, the bit line barrier layer 248b, the upper silicide layer 248c, the bit line electrode layer 248d, and the bit line capping layer 248e may be formed using a CVD process. Each of the lower and upper silicide layers 248a and 248c may include titanium silicide, tungsten silicide, tantalum silicide, cobalt silicide, or various other metal silicides. The bit line barrier layer 248b may include titanium, tantalum, tantalum nitride, tungsten nitride, or titanium nitride. The bit line electrode layer 248d may include tungsten, aluminum, copper, or nickel. The bit line capping layer 248e may include silicon nitride.

Figure 18A:
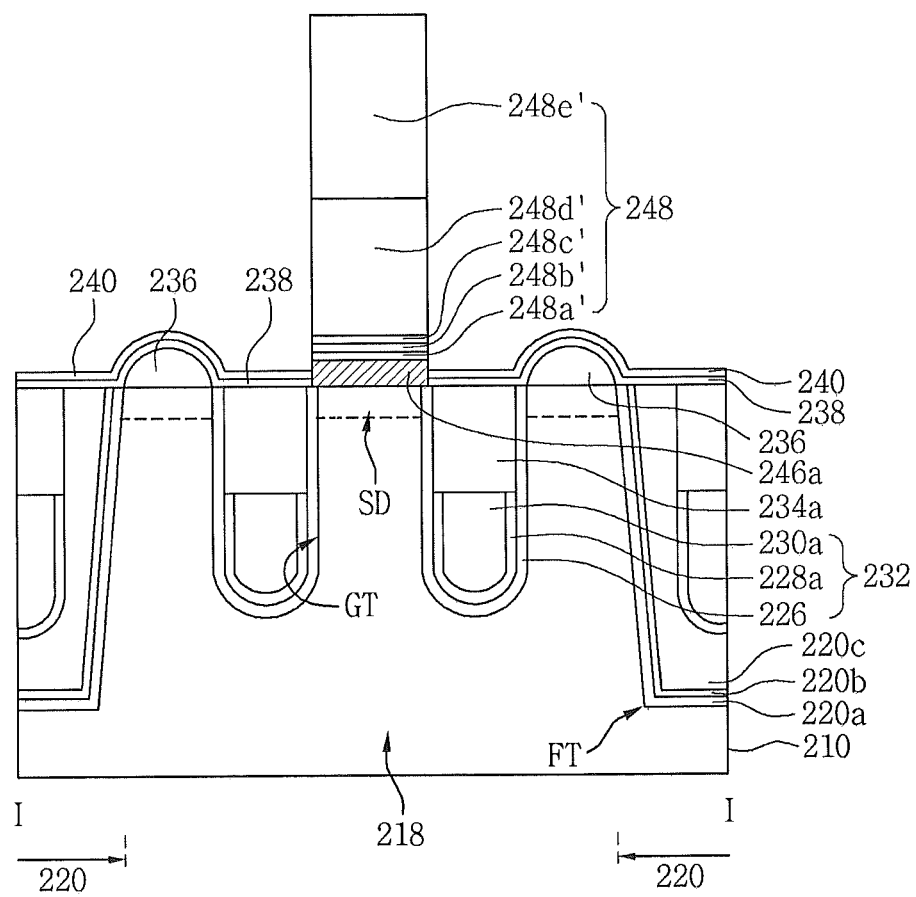
Figure 18B:
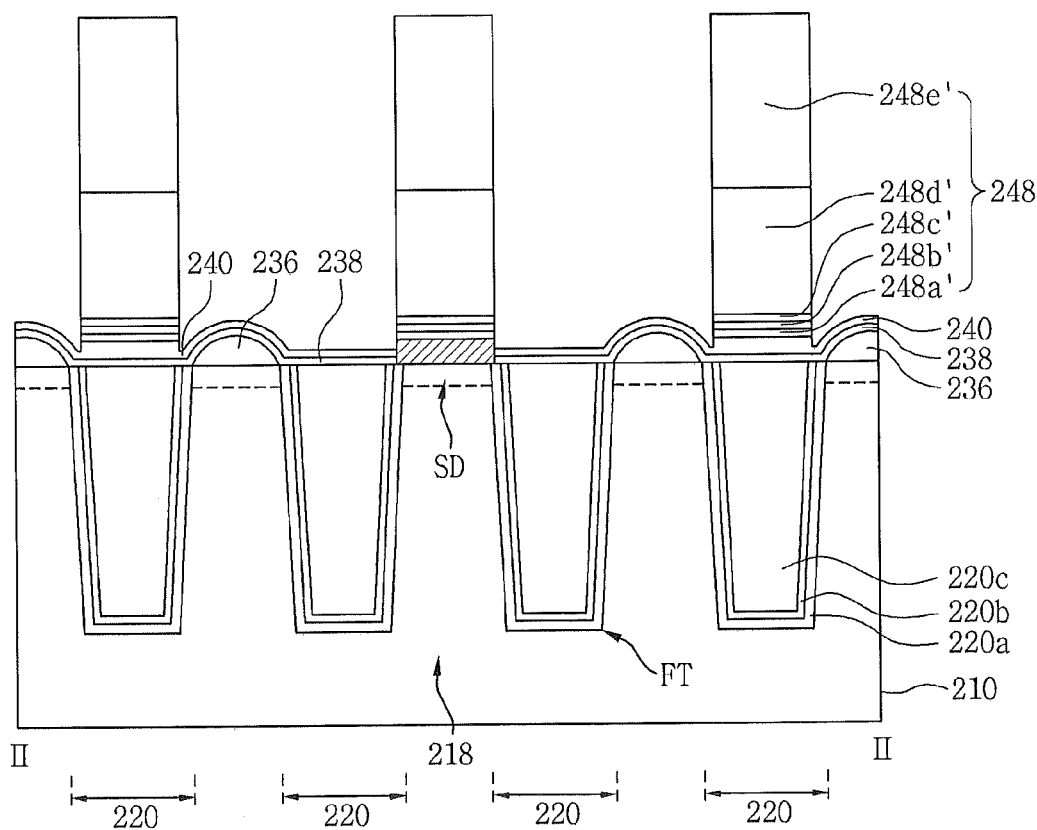

Referring now to FIGS. 4, 18A, and 18B, the method of fabricating semiconductor devices according to some embodiments of the inventive concept may include forming a bit line stack 248 (operation S122). The bit line stack 248 may extend in a second direction to cross the gate line (or word line) 232 at right angles. The formation of the bit line stack 248 may include patterning the lower silicide layer 248a, the bit line barrier layer 248b, the upper silicide layer 248c, the bit line electrode layer 248d, and the bit line capping layer 248e shown in FIGS. 17A and 17B. The patterning process may include photolithography and etching processes. Thus, the bit line stack 248 may include a patterned upper silicide layer 248a', a patterned lower silicide layer 248c', a patterned bit line barrier layer 248b', a patterned bit line electrode layer 248d', and a patterned bit line capping layer 248e'. During the above-described etching process, an upper portion of the first interlayer insulating layer 240 may be partially removed, and the thickness of the interlayer insulating layer may be reduced.

Figure 19A:
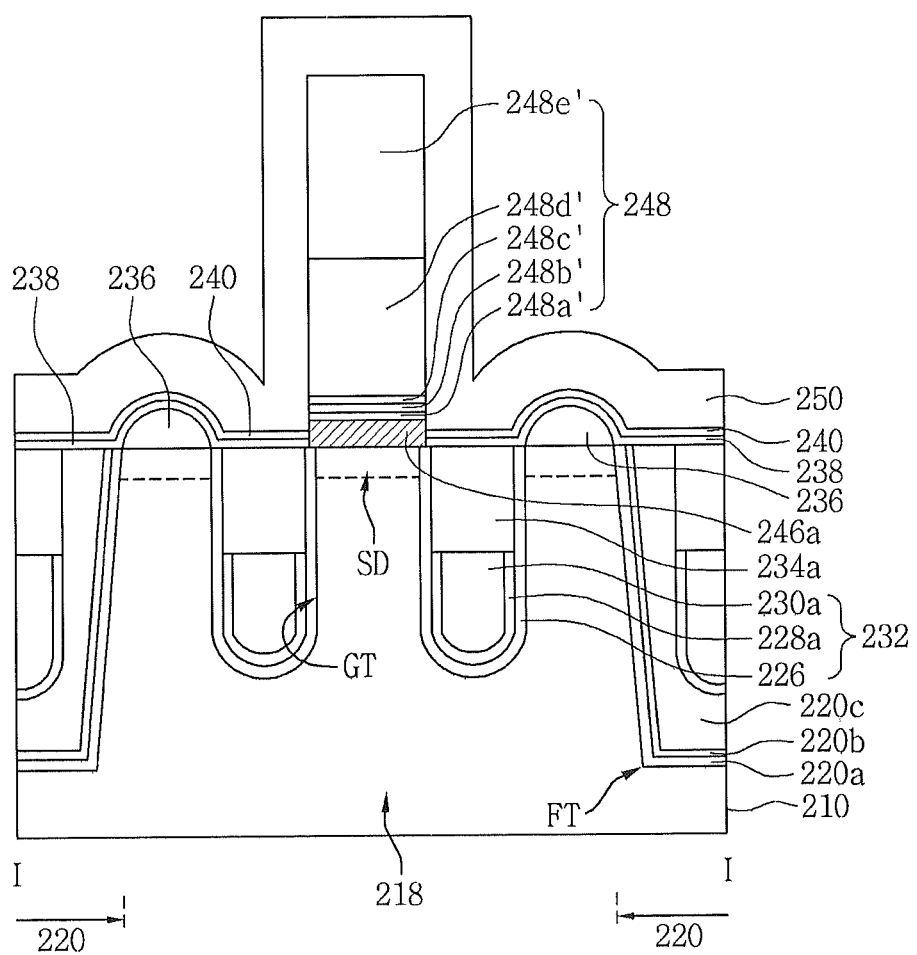
Figure 19B:
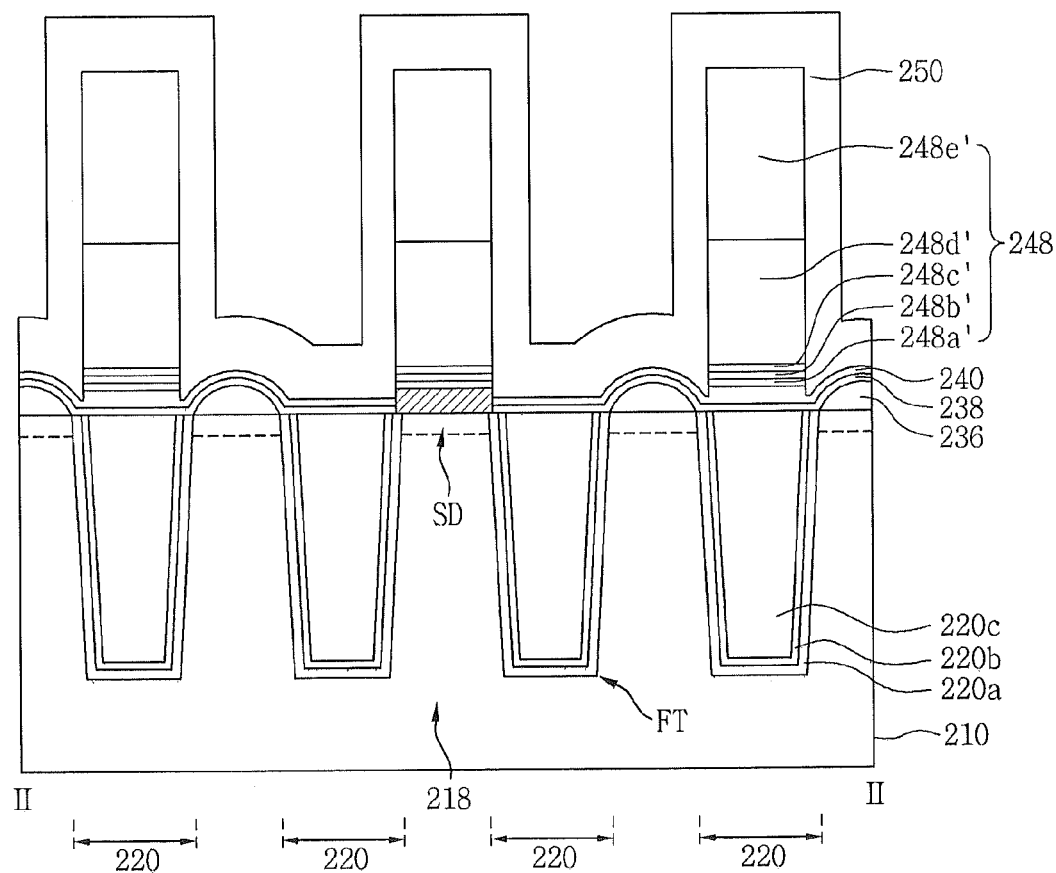

Referring now to FIGS. 19A and 19B, the method of fabricating semiconductor devices according to some embodiments of the inventive concept may include forming a bit line sidewall spacer layer 250 to cover the bit line stack 248 and the first interlayer insulating layer 240. The bit line sidewall spacer layer 250 may include silicon nitride. The formation of the bit line sidewall spacer layer 250 may include a CVD process.

Figure 20A:
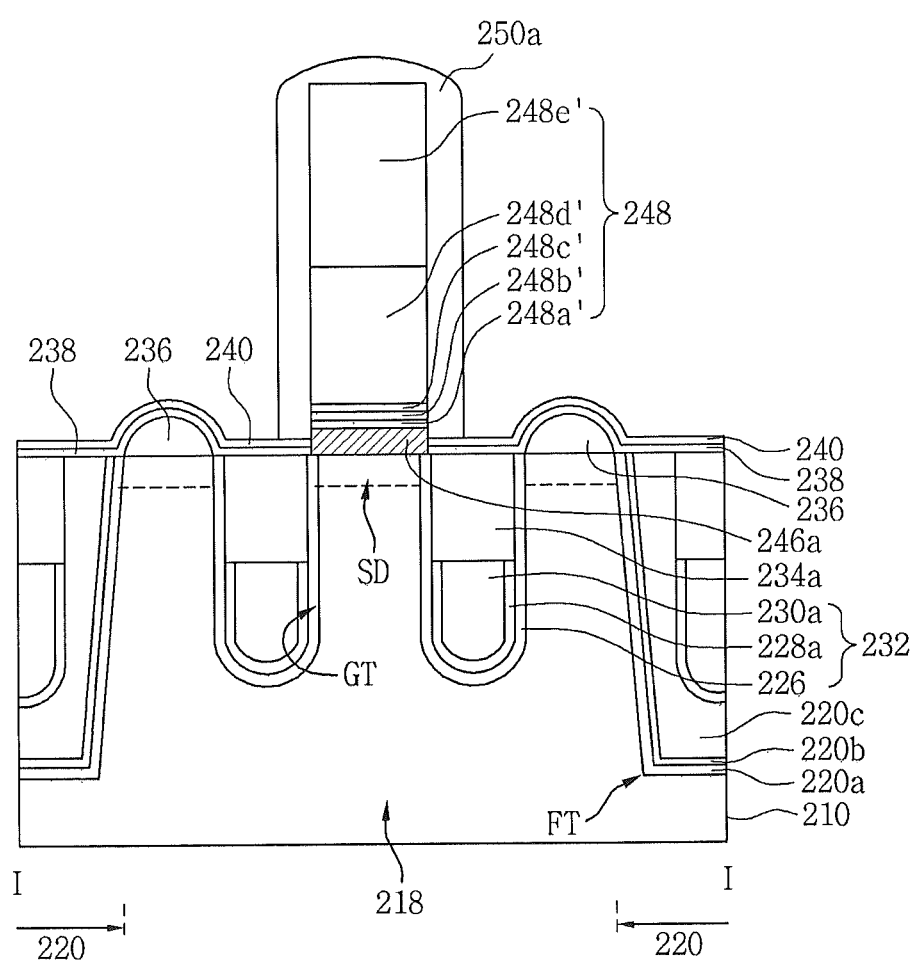
Figure 20B:
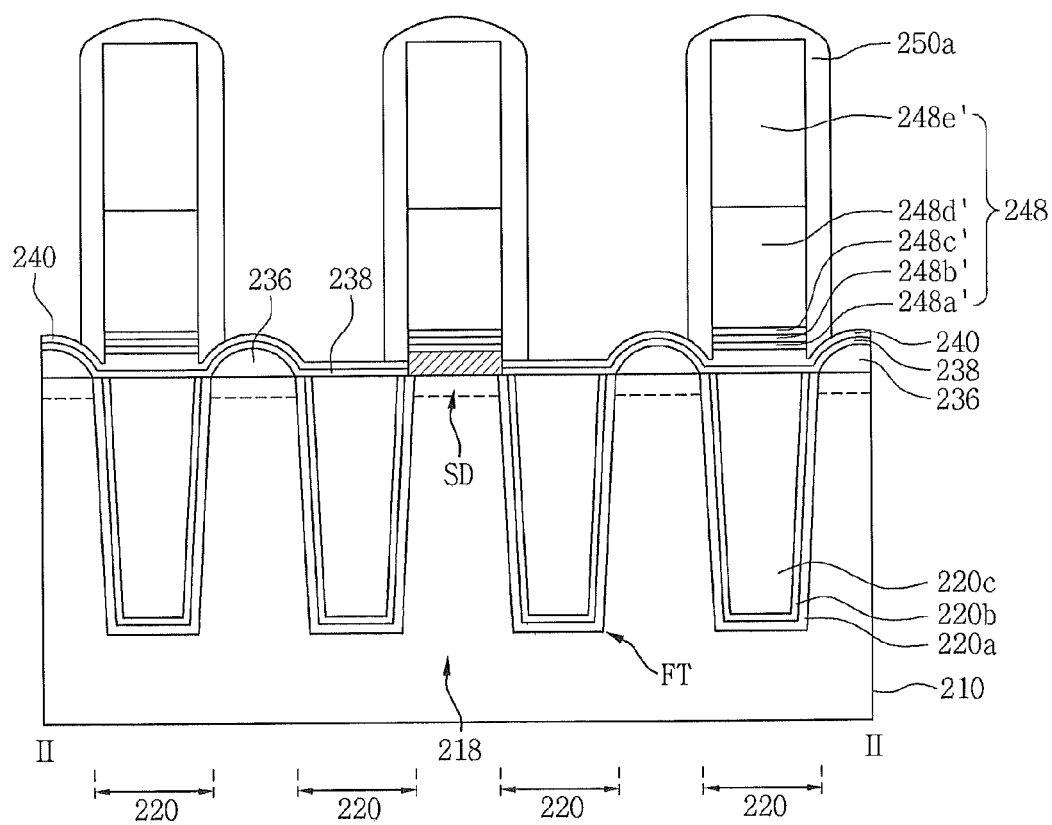

Referring to FIGS. 4, 20A, and 20B, the method of fabricating semiconductor devices according to some embodiments of the inventive concept may include forming bit line sidewall spacers 250a on sidewalls of the bit line stack 248 (operation S124). The bit line sidewall spacers 250a may be formed using an etchback process.

The bit line sidewall spacers 250a may vertically overlap portions of the silicon crystalline layers 236 by interposing the etch stop layer 238 and the first interlayer insulating layer 240 therebetween. A portion of the first interlayer insulating layer 240 may be exposed between the bit line sidewall spacers 250a.

Figure 21A:
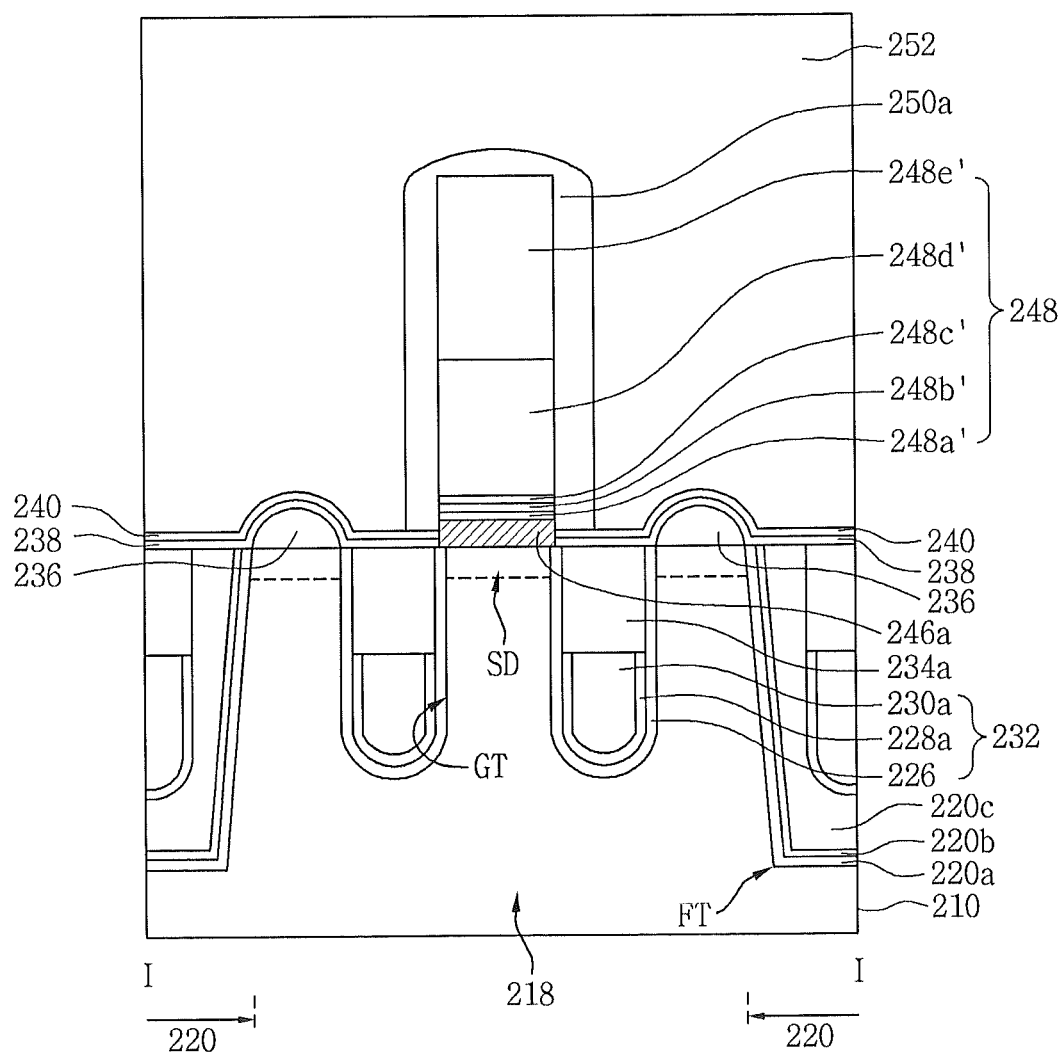
Figure 21B:
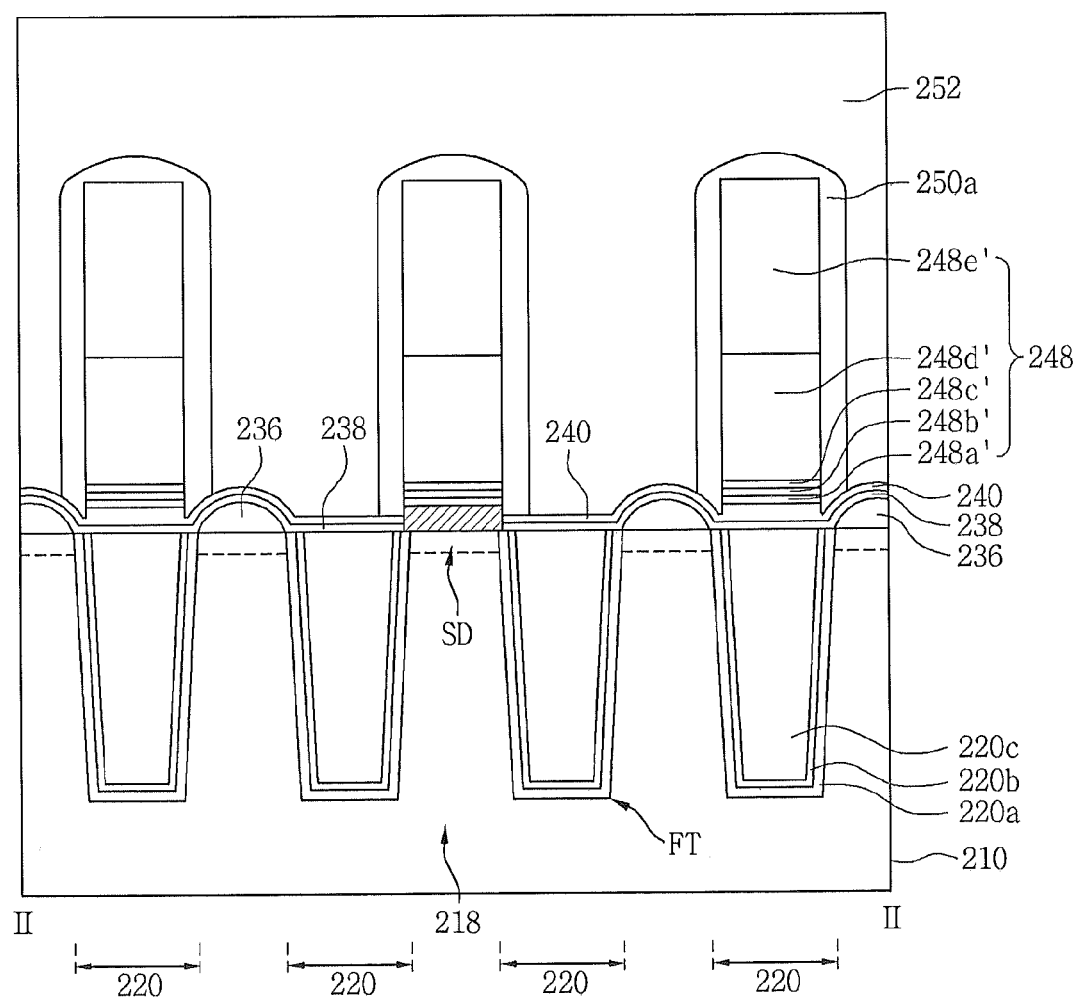

Referring now to FIGS. 21A and 21B, the method of fabricating semiconductor devices according to some embodiments of the inventive concept may include forming a second interlayer insulating layer 252 to cover the bit line sidewall spacers 250a and the first interlayer insulating layer 240. The second interlayer insulating layer 252 may be formed using a CVD process and include silicon oxide.

Figure 22A:
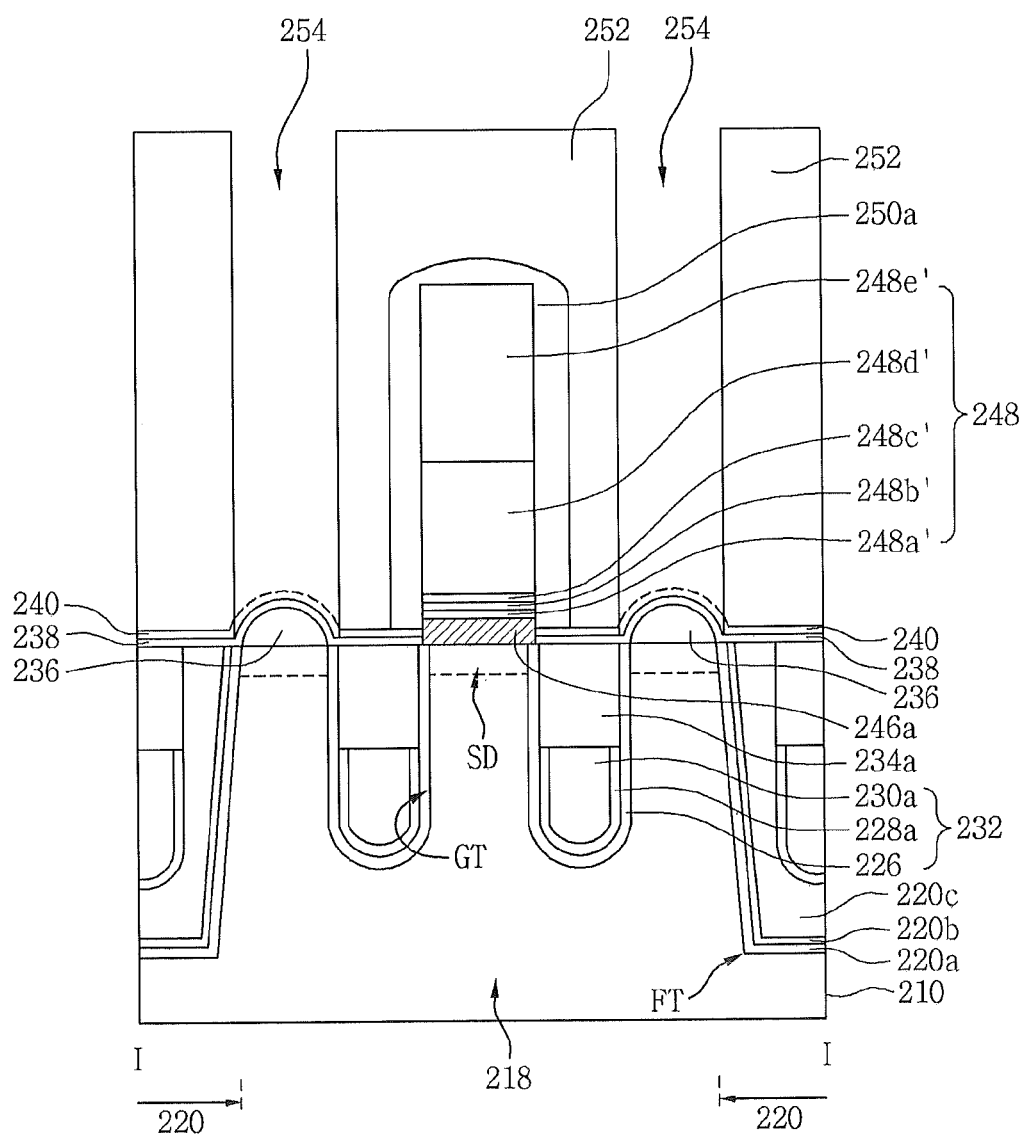
Figure 22B:
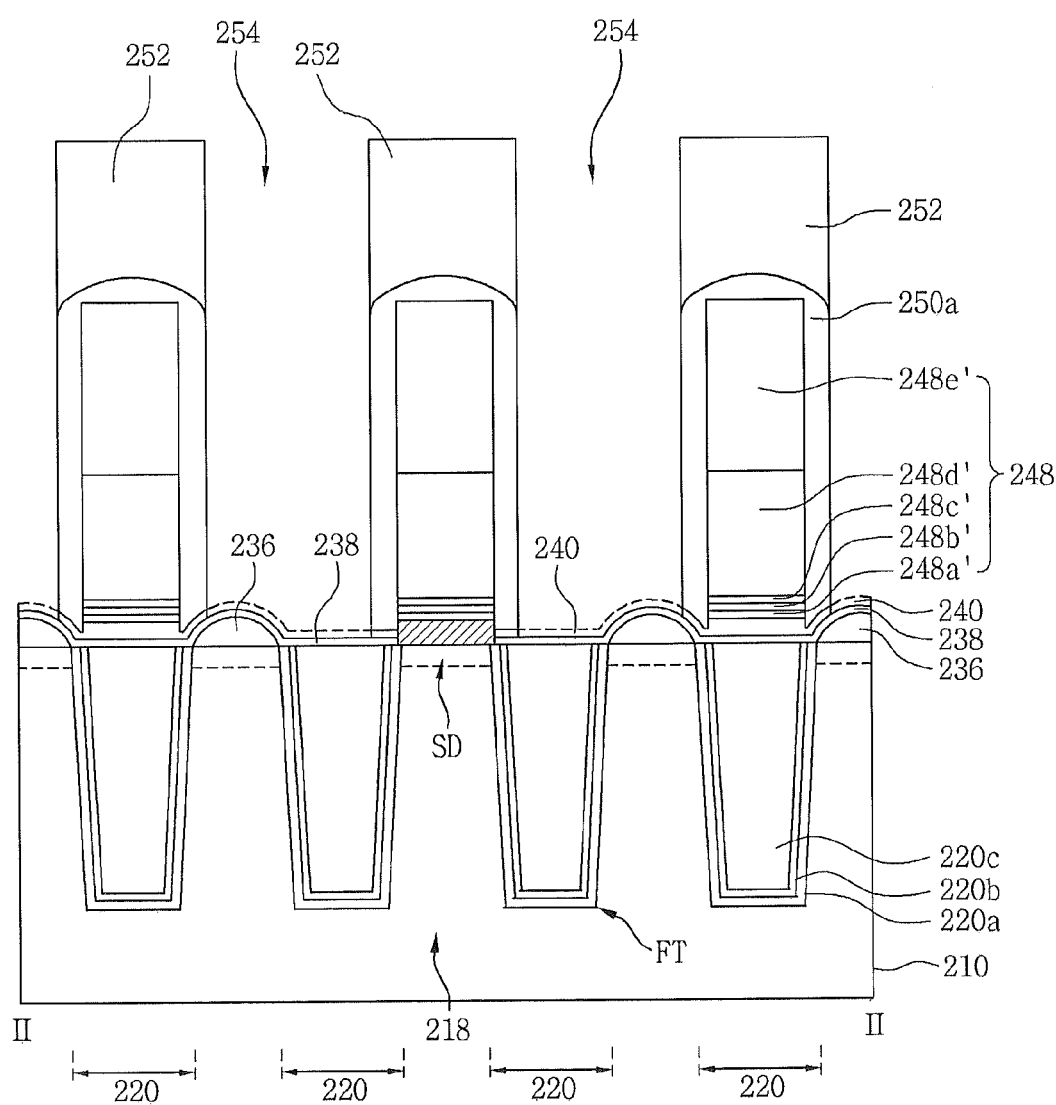

Referring to FIGS. 4, 22A, and 22B, the method of fabricating semiconductor devices according to some embodiments of the inventive concept may include forming storage contact holes 254 (operation S126). The formation of the storage contact holes 254 may include removing the second interlayer insulating layer 252 from the remaining portion of the silicon crystalline layer 236 that is not overlapped by the bit line sidewall spacers 250a. The storage contact holes 254 may be vertically aligned with the storage contact portion BC. The storage contact holes 254 may be formed using photolithography and etching processes. In these embodiments, portions of the first interlayer insulating layer 240 exposed by the storage contact holes 254 may be removed to expose the etch stop layer 238.

Figure 23A:
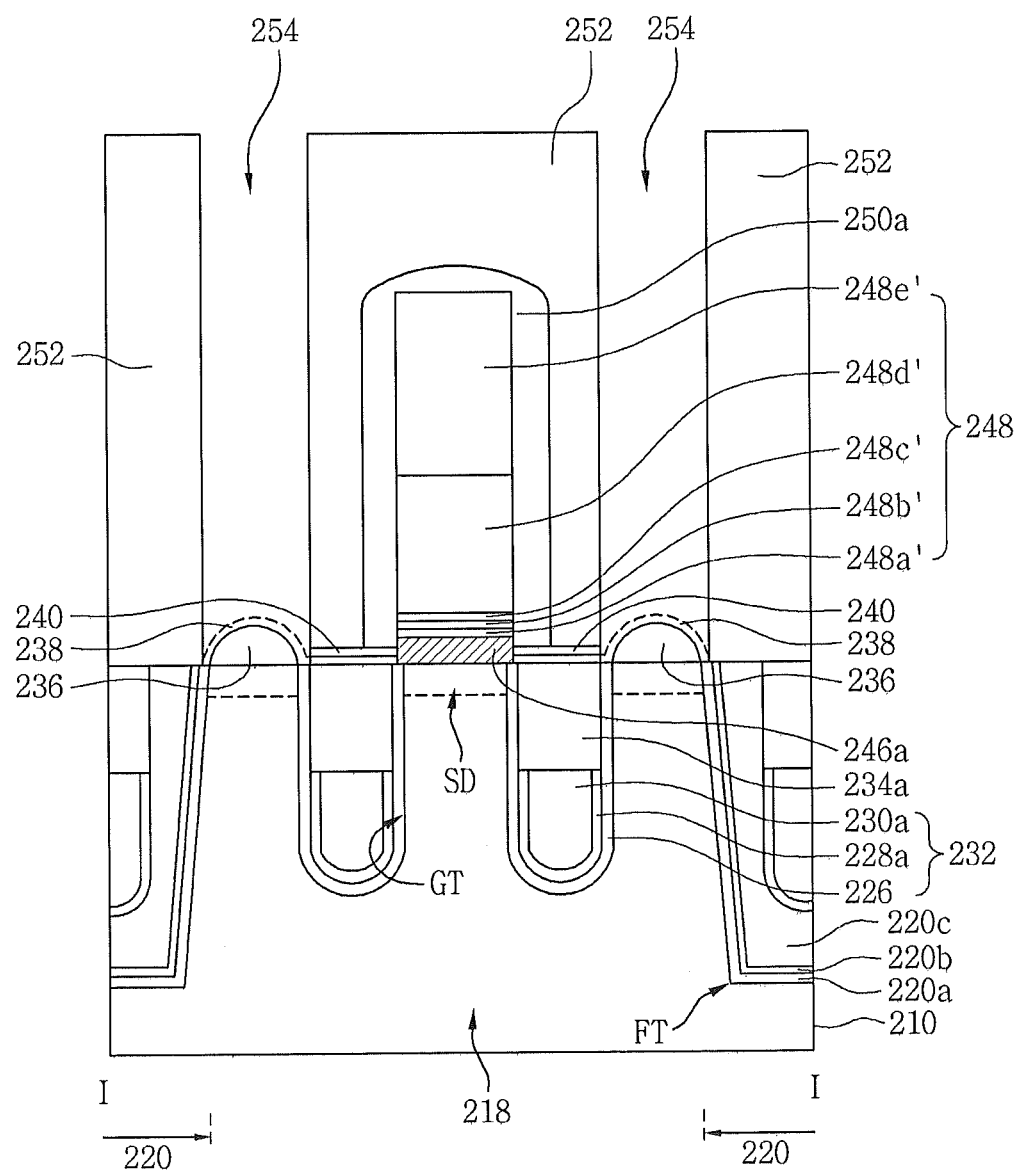
Figure 23B:
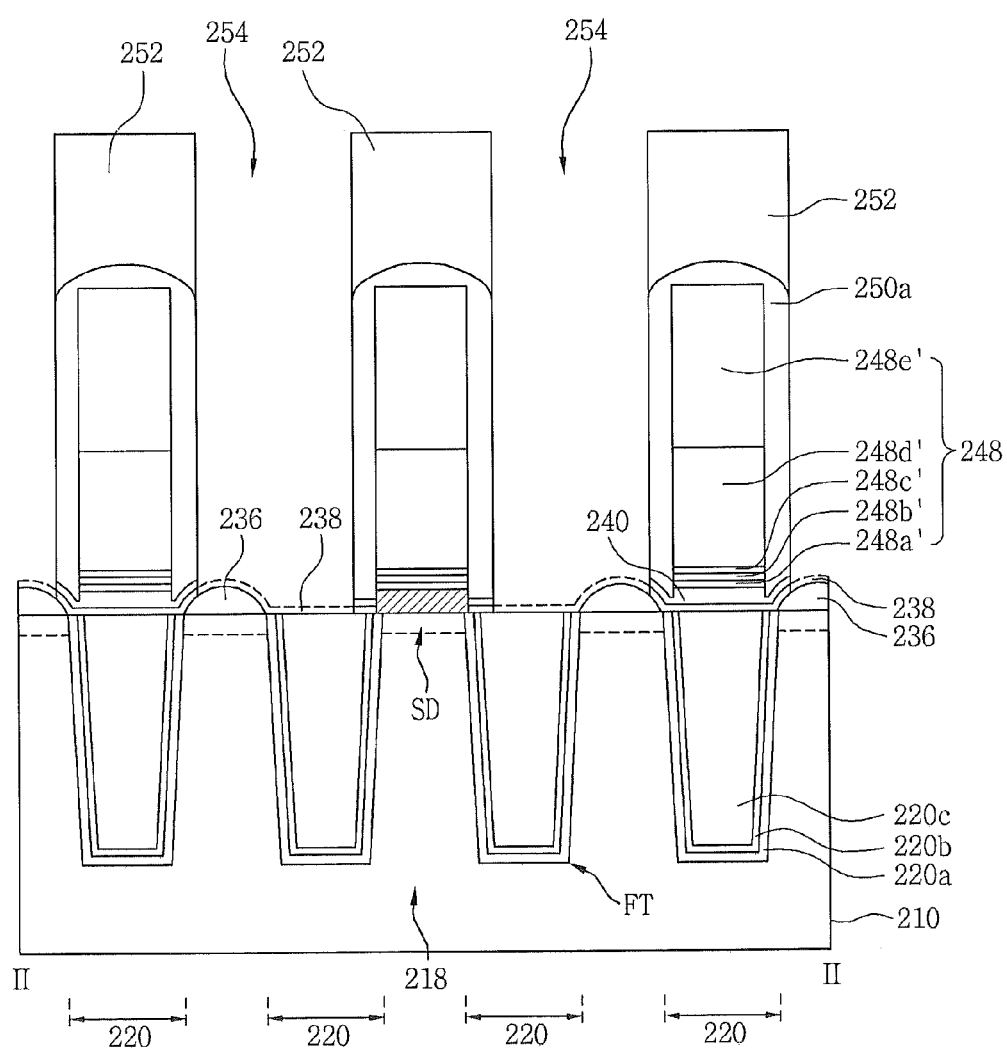

Referring now to FIGS. 23A and 23B, the method of fabricating semiconductor devices according to some embodiments of the inventive concept may include removing the etch stop layer 238 disposed under the storage contact holes 254 to expose the silicon crystalline layer 236. When the etch stop layer 238 is removed, the silicon crystalline layer 236 that is not covered with the bit line sidewall spacers 250a may be exposed. The removal of the etch stop layer 240 may include a dry etching process.

Figure 24A:
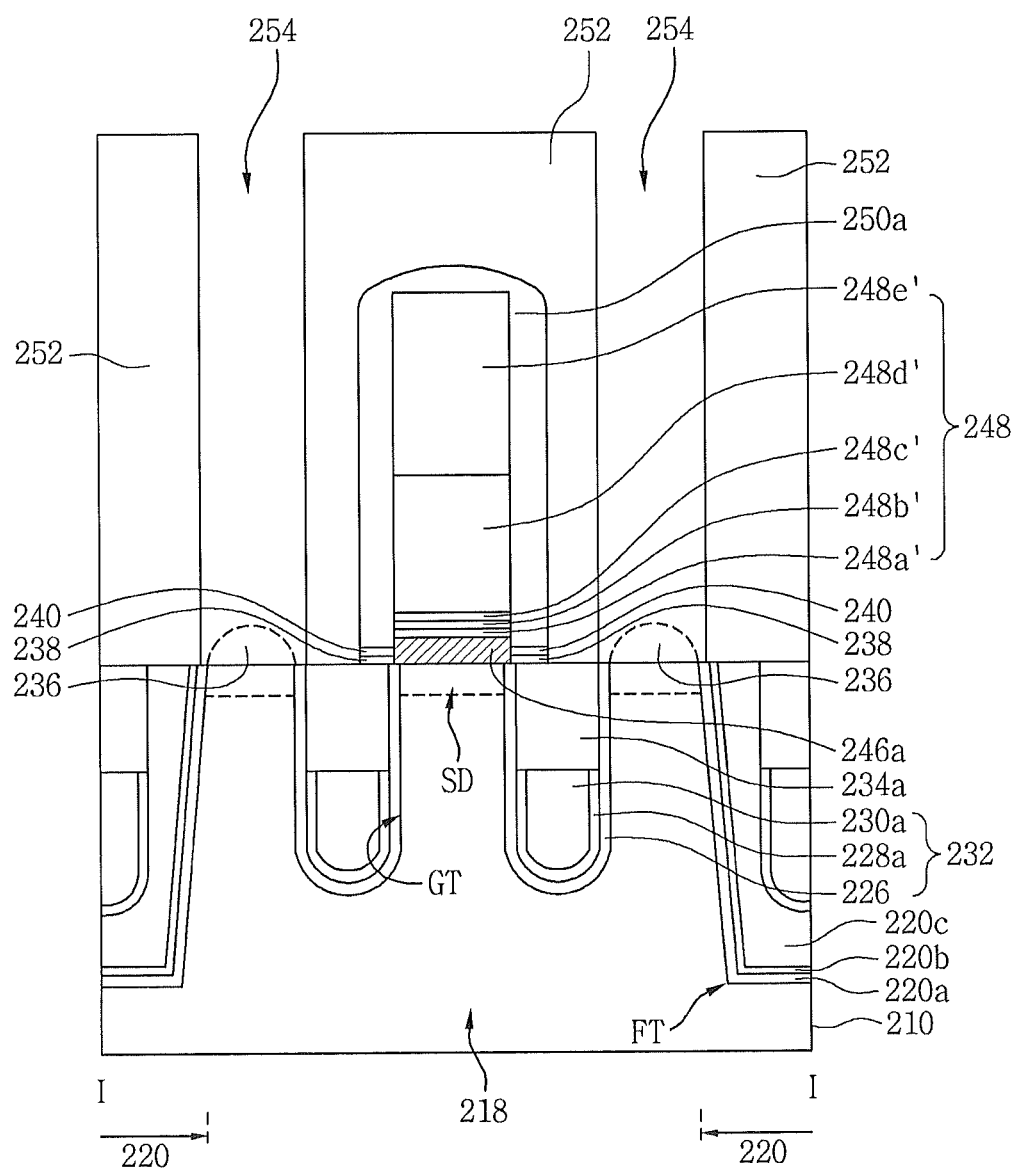
Figure 24B:
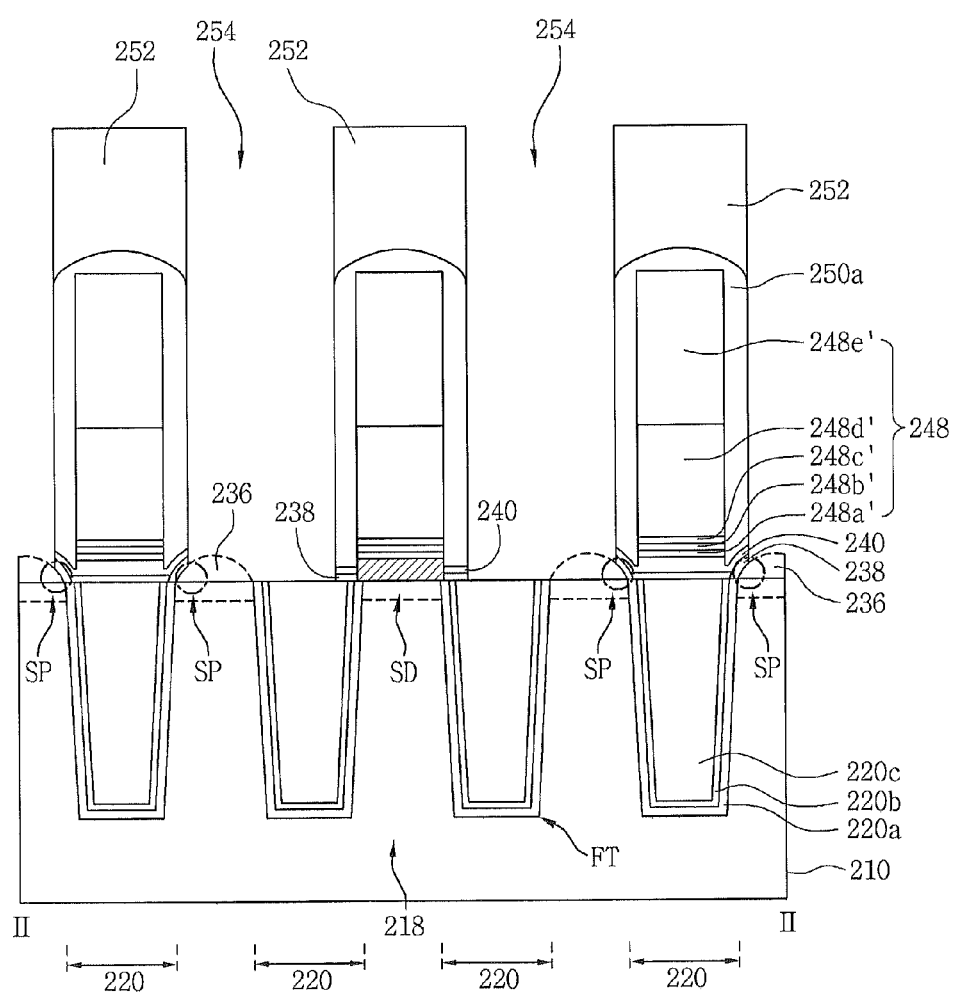

Referring now to FIGS. 4, 24A, and 24B, the method of fabricating semiconductor devices according to some embodiments of the inventive concept may include removing the silicon crystalline layer 236 disposed under the storage contact holes 254 to expose the active region 218 (operation S128). As discussed above, the removal of the silicon crystalline layer 236 may include a wet etching process and a dry etching process. For example, when the silicon crystalline layer 236 is formed of silicon germanium or silicon carbon unlike the substrate 210, the silicon crystalline layer 236 may be removed by means of a wet etching process using an etchant having an etch selectivity. In contrast, when the silicon crystalline layer 236 is formed of silicon like the substrate 210, the silicon crystalline layer 236 may be removed using a dry etching process. In these embodiments, portions of the silicon crystalline layer 236 overlapped by the bit line sidewall spacers 250a may also be removed, and spaces SP may be formed under both sides of the bit line sidewall spacers 250a. Thus, the active regions 218 may be exposed more widely by as much as the spaces SP. Furthermore, since the underlying active regions 218 may retain recess-free structures during a process of removing the silicon crystalline layer 236, the distance between the exposed surface of the active region 218 and the gate electrode 230a may not be significantly reduced.

Figure 25A:
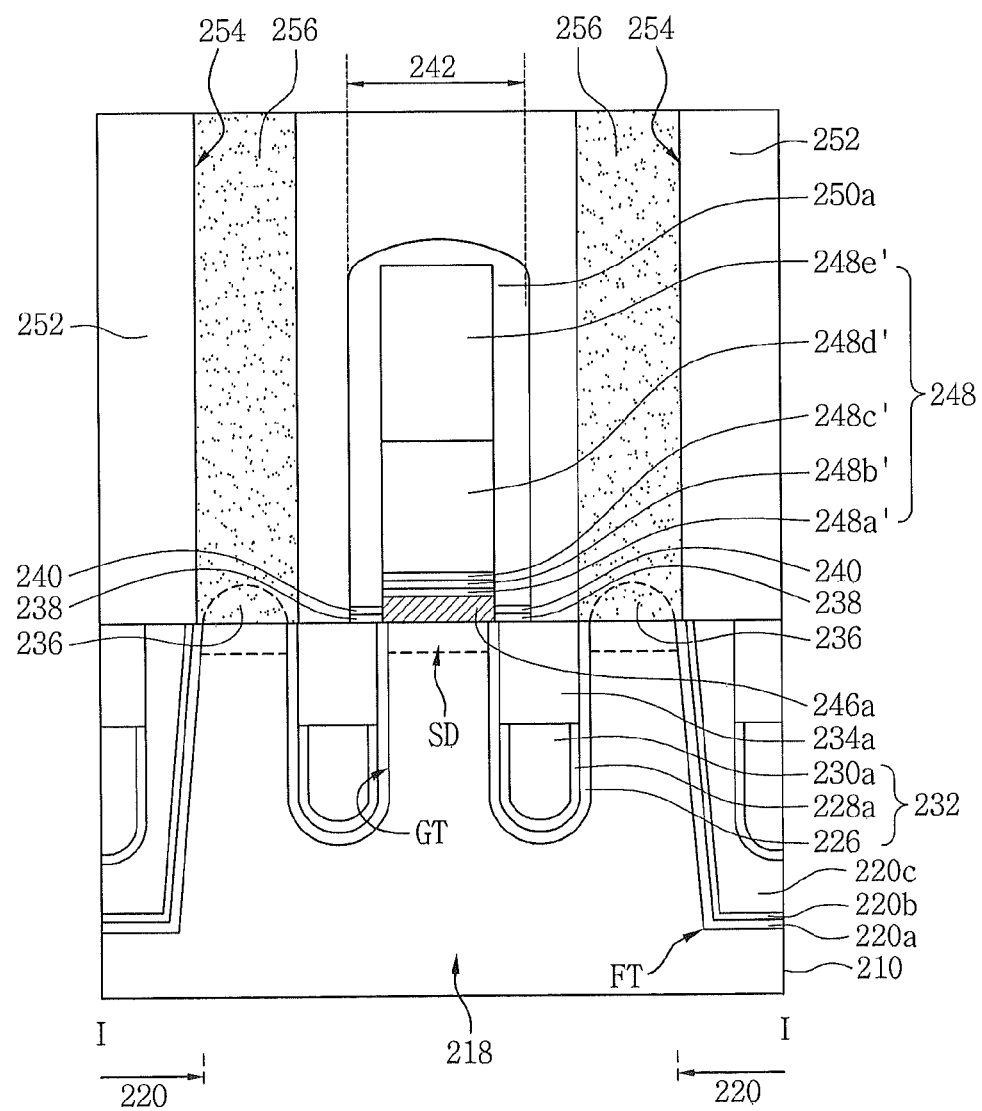
Figure 25B:
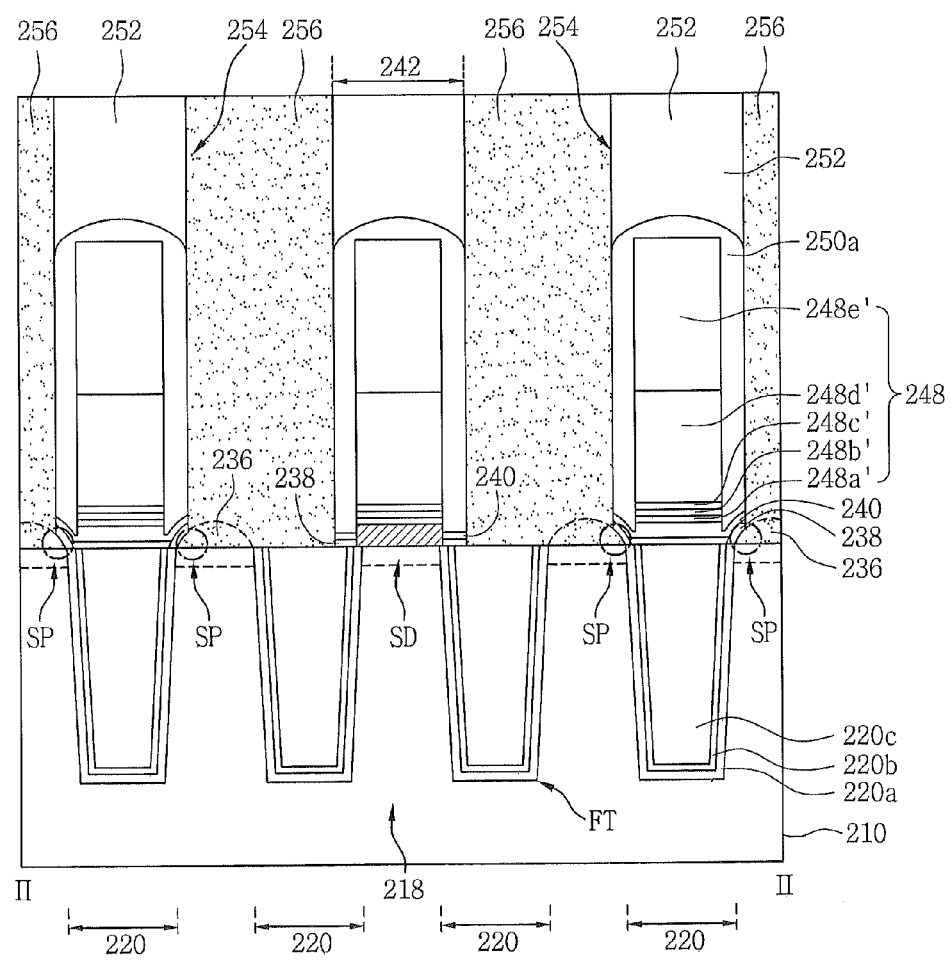

Referring now to FIGS. 4, 25A, and 25B, the method of fabricating semiconductor devices according to some embodiments of the inventive concept may include forming storage contact plugs 256 within the storage contact holes 254 (operation S130). The storage contact plugs 256 may include a conductive material, such as doped poly-Si or a metal. Thereafter, a process of forming storage electrodes in contact with the storage contact plugs 256 and a process of stacking a dielectric layer and plate electrodes on the storage electrodes may be performed.

Figure 26:
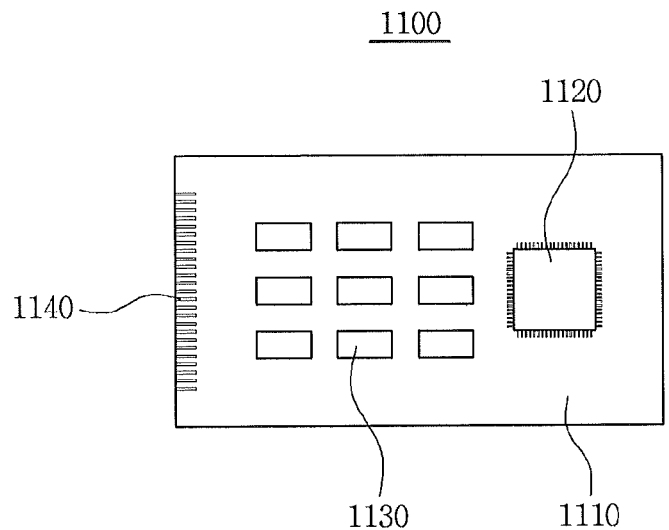
FIG. 26 is a diagram of a module including semiconductor devices according to some embodiments of the inventive concept.

Referring now to FIG. 26, a schematic diagram of a module 1100 including a semiconductor device according to some embodiments of the inventive concept will be discussed. As illustrated in FIG. 26, the module 1100 according to some embodiments of the inventive concept may include a semiconductor device 200 according to some of the inventive concept, which is mounted on a module substrate 1110. The module 1100 may further include a microprocessor (MP) 1120 mounted on the module substrate 1110. Input/output (I/O) terminals (1140) may be disposed on at least one side of the module substrate 1110.

Figure 27:
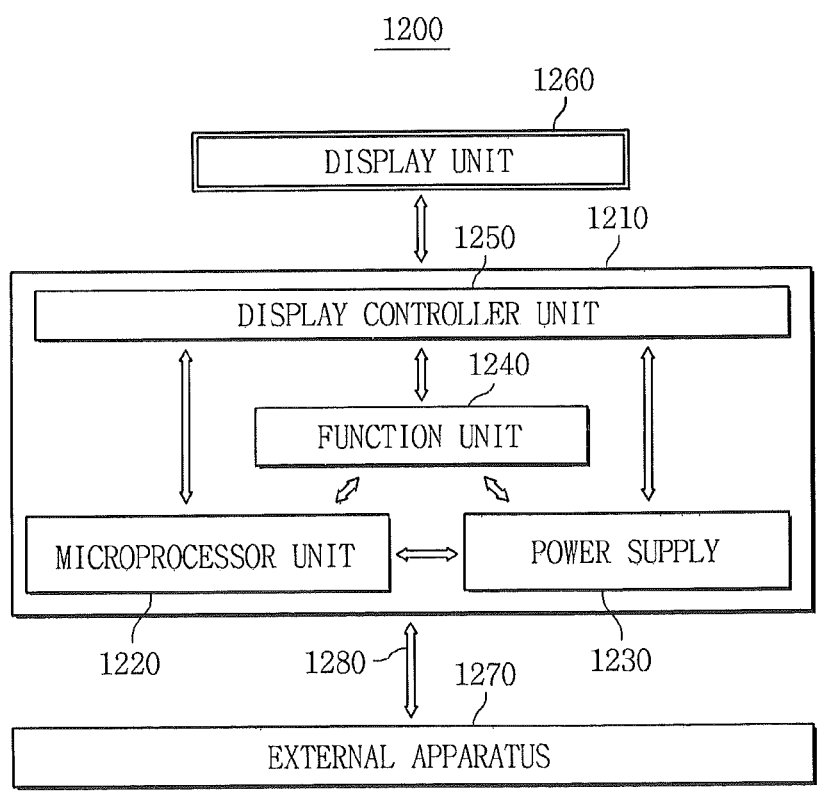
FIG. 27 is a block diagram of an electronic system including a semiconductor device according to some embodiments of the inventive concept.

Referring now to FIG. 27, a conceptual block diagram of an electronic system 1200 including a semiconductor device 200 according to some embodiments of the inventive concept will be discussed. As illustrated in FIG. 27, the semiconductor device 200 according to some embodiments of the inventive concept may be applied to the electronic system 1200. The electronic system 1200 may include a body 1210, an MP unit 1220, a power supply 1230, a function unit 1240, and/or a display controller unit 1250. The body 1210 may be a system board or mother board including a printed circuit board (PCB). The MP unit 1220, the power supply 1230, the function unit 1240, and the display controller unit 1250 may be mounted on the body 1210. The display unit 1260 may be disposed on a top surface of the body 1210 or outside the body 1210. For example, the display unit 1260 may be disposed on the surface of the body 1210 and display an image processed by the display controller unit 1250. The power supply 1230 may function to receive a predetermined voltage from an external battery, divide the voltage into various voltage levels, and supply the divided voltages to the MP unit 1220, the function unit 1240, and the display controller unit 1250. The MP unit 1220 may receive a voltage from the power supply 1230 and control the function unit 1240 and the display unit 1260. The function unit 1240 may serve various functions of the electronic system 1200. For example, when the electronic system 1200 is a mobile electronic device, such as a portable phone, the function unit 1240 may include several components capable of serving wireless communication functions, for example, outputting an image to the display unit 1260 or outputting a voice to a speaker, by dialing or communicating with an external apparatus 1270. When a camera is also mounted, the function unit 1240 may serve as a camera image processor. In applied embodiments, when the electronic system 1200 is connected to a memory card to increase capacity, the function unit 1240 may be a memory card controller. The function unit 1240 may transmit/receive signals to/from the external apparatus 1270 through a wired or wireless communication unit 1280. Furthermore, when the electronic system 1200 requires a universal serial bus (USB) to increase functionality, the function unit 1240 may serve as an interface controller.

Figure 28:
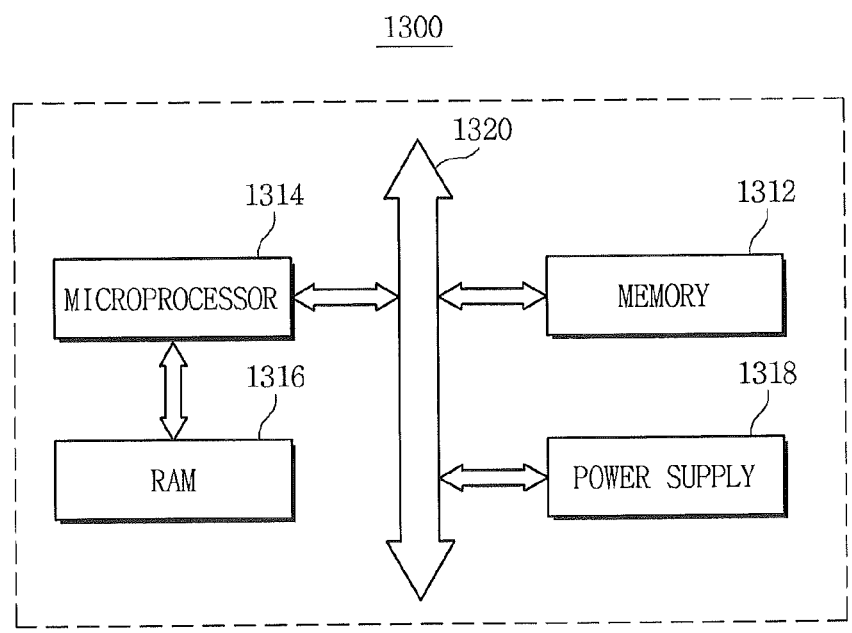
FIG. 28 is a block diagram of an electronic system including a semiconductor device according to some embodiments of the inventive concept.

Referring now to FIG. 28, a schematic block diagram of an electronic system 1300 including a semiconductor device according to some embodiments of the inventive concept will be discussed. As illustrated in FIG. 28, the electronic system 1300 may include a semiconductor device 200 according to some embodiments of the inventive concept. The electronic system 1300 may be applied to a mobile electronic device or a computer. For example, the electronic system 1300 may include a memory system 1312, an MP 1314, a random access memory (RAM) 1316, and a user interface 1318 configured to communicate data using a bus 1320. The MP 1314 may program and control the electronic system 1300. The RAM 1316 may be used as an operation memory of the MP 1314. For example, the MP 1314 or the RAM 1316 may include the semiconductor device 200 according to some embodiments of the inventive concept. The MP 1314, the RAM 1316, and/or other elements may be assembled within a single package. The user interface 1318 may be used to input data to the electronic system 1300 or output data from the electronic system 1300. The memory system 1312 may store codes for operating the MP 1314, data processed by the MP 1314, or external input data. The memory system 1312 may include a controller and a memory.

Figure 29:
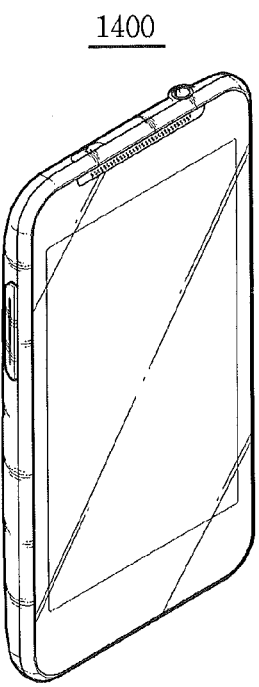
FIG. 29 is a schematic diagram of a mobile electronic device including a semiconductor device according to some embodiments of the inventive concept.

Referring now to FIG. 29, a schematic diagram of a mobile electronic device including a semiconductor device according to some embodiments of the inventive concept will be discussed. The mobile electronic device 1400 may be interpreted as a tablet PC. Furthermore, at least one of the semiconductor devices 200 according to some embodiments of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

In some embodiments of the inventive concept, a sacrificial layer is provided under bit line sidewall spacers overlapping active regions, and removed so that the area of a storage contact can further increase by as much as the active regions disposed under the bit line sidewalls spacers.

When the area of the storage contact increases, since it is unnecessary to dope excessive impurities into a storage contact plug to lower contact resistance, generation of a GIDL between a gate electrode and source/drain regions due to diffusion of impurities can be reduced.

In some embodiments, a sacrificial layer is formed in an active region so that the active region cannot be affected by the sacrificial layer during formation of a storage contact hole. As a result, the active region can retain a recess-free structure.

In these embodiments, since the distance between the surface of the storage contact portion of the active region and the gate electrode can be stabilized, a GIDL can be reduced.

Due to the reduction of the GIDL, operating characteristics of the semiconductor device can be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, the method comprising:
    forming a field region in a substrate defining an active region;
    forming first and second gate lines in the substrate, the first and second gate lines disposed across the active region in a first direction and spaced apart and parallel to each other;
    forming first through third silicon crystalline layers on first through third surfaces of the active region divided by the first and second gate lines;
    forming an etch stop layer to cover the entire surface of the substrate having the first through third silicon crystalline layers;
    removing the first silicon crystalline layer between the first and second gate lines and the etch stop layer to expose the first surface of the active region;
    forming a bit line stack electrically connected to the exposed first surface, the bit line stack configured to cross the first and second gate lines and extend in a second direction, different from the first direction;
    forming bit line sidewall spacers on both side surfaces of the bit line stack, the bit line sidewall spacers vertically aligned with portions of the second and third silicon crystalline layers of the active region;
    forming an interlayer insulating layer to cover the entire surface of the substrate including bit lines and bit line sidewall spacers;
    removing the interlayer insulating layer to define storage contact holes exposing the etch stop layer disposed on the second and third silicon crystalline layers except portions covered with the bit line sidewall spacers;
    removing the second and third silicon crystalline layers disposed under the storage contact holes and the bit line sidewall spacers to expose the second and third surfaces of the active region; and
    forming storage contact plugs in the storage contact holes in contact with the second and third surfaces of the active region.

2. The method of claim 1, wherein the first through third silicon crystalline layers are formed using an epitaxial growth process.

3. The method of claim 2, wherein the silicon crystalline layers have hemispherical shapes.

4. The method of claim 1, wherein the first through third silicon crystalline layers are formed of one selected out of silicon compounds including silicon germanium and silicon carbon.

5. The method of claim 1, wherein the forming of the first and second gate lines comprises:
    forming gate trenches in the substrate;
    forming a gate insulating layer on inner walls of the gate trenches;
    forming a gate electrode on the gate insulating layer to fill portions of the gate trenches; and
    forming a gate capping layer on the gate electrode to completely fill the gate trenches.

6. The method of claim 1, wherein the bit line stack comprises a lower silicide layer electrically connected to the first surface of the active region and a bit line barrier layer, an upper silicide layer, a bit line electrode layer, and a bit line capping layer sequentially stacked on the lower silicide layer.

7. The method of claim 6, further comprising forming a bit line contact plug to electrically connect the bit line stack with the first surface of the active region.

8. The method of claim 1, further comprising forming an insulating layer between the bit line sidewall spacers and the etch stop layer disposed under the bit line sidewall spacers.

9. The method of claim 8, wherein the etch stop layer includes silicon nitride, and the insulating layer includes silicon oxide.

10. A method of fabricating a semiconductor device, the method comprising:
   forming a field region in a substrate defining an active region;
   forming first and second gate lines in the substrate, the first and second gate lines disposed across the active region in a first direction and spaced apart and parallel to each other;
   dividing the active region into a bit line contact portion and first and second storage contact portions by the first and second gate lines;
   forming a silicon crystalline layer on the bit line contact portion and the first and second storage contact portions of the active region;
   forming an etch stop layer and a first interlayer insulating layer on the silicon crystalline layer;
   removing the first interlayer insulating layer, the etch stop layer, and the silicon crystalline layer on the bit line contact portion between the first and second gate lines to form a bit line contact hole exposing the underlying active region;
   forming a bit line contact plug in contact with the exposed active region;
   forming a bit line stack in contact with the bit line contact plug;
   forming bit line sidewall spacers on both sidewalls of the bit line stack to cover the first interlayer insulating layer disposed on portions of the first and second storage contact portions;
   forming a second interlayer insulating layer on the entire surface of the substrate including the bit line sidewall spacers;
   patterning the first and second interlayer insulating layers to form first and second storage contact holes exposing the etch stop layer disposed on the first and second storage contact portions except portions covered with the bit line sidewall spacers;
   removing the etch stop layer exposed by the first and second storage contact holes to expose the underlying silicon crystalline layer;
   removing the silicon crystalline layer disposed under the first and second storage contact holes and the bit line sidewall spacers to expose the active region; and
   forming first and second storage contact plugs in contact with the exposed active region.

11. The method of claim 10, wherein each of the first and second gate lines includes a gate insulating layer, a gate barrier layer, a gate electrode, and a gate capping layer disposed in the substrate and stacked sequentially.

12. The method of claim 10, wherein the silicon crystalline layer is formed using an epitaxial growth process.

13. The method of claim 10, wherein the etch stop layer includes silicon nitride, and the first interlayer insulating layer includes silicon oxide.

14. The method of claim 10, wherein the remaining etch stop layer and first interlayer insulating layer after removing are disposed between the lower surface of the sidewall spacers and the contact plug.

15. The method of claim 10, wherein the first and second storage contact plugs include doped polysilicon.

16. A method of a semiconductor device, the method comprising:
   dividing an active region of a semiconductor substrate into a bit line contact portion and first and second storage contact portions by first and second gate lines;
   forming a silicon crystalline layer on the bit line contact portion and the first and second storage contact portions of the active region;
   forming an etch stop layer and a first interlayer insulating layer on the silicon crystalline layer;
   removing the first interlayer insulating layer, the etch stop layer, and the silicon crystalline layer on the bit line contact portion between the first and second gate lines to form a bit line contact hole exposing the underlying active region;
   forming a bit line contact plug in contact with the exposed active region;
   forming a bit line stack in contact with the bit line contact plug; and
   forming bit line sidewall spacers on both sidewalls of the bit line stack to cover the first interlayer insulating layer disposed on portions of the first and second storage contact portions.

17. The method of claim 16, wherein an area of the first and second storage contacts increases by a portion of the active region disposed under the bit line sidewall spacers.

* * * * *